(12) United States Patent
Fu

(10) Patent No.: US 10,991,773 B2
(45) Date of Patent: Apr. 27, 2021

(54) DISPLAY PANEL WITH LIGHT-EMITTING FUNCTIONAL UNITS, DISPLAY DEVICE AND METHOD FOR MANUFACTURING DISPLAY PANEL

(71) Applicant: Xiamen Tianma Micro-Electronics Co., Ltd, Xiamen (CN)

(72) Inventor: Jujian Fu, Xiamen (CN)

(73) Assignee: Xiamen Tianma Micro-Electronics Co., Ltd, Xiamen (CN)

( * ) Notice: Subject to any disclaimer, the term of this patent is extended or adjusted under 35 U.S.C. 154(b) by 71 days.

(21) Appl. No.: 16/503,401

(22) Filed: Jul. 3, 2019

(65) Prior Publication Data

US 2020/0251539 A1 Aug. 6, 2020

(30) Foreign Application Priority Data

Jan. 31, 2019 (CN) .......................... 201910100174.8

(51) Int. Cl.
*H01L 27/32* (2006.01)
*H01L 51/52* (2006.01)
*H01L 27/12* (2006.01)

(52) U.S. Cl.
CPC ...... *H01L 27/3244* (2013.01); *H01L 27/3211* (2013.01); *H01L 27/3216* (2013.01);
(Continued)

(58) Field of Classification Search
CPC combination set(s) only.
See application file for complete search history.

(56) References Cited

U.S. PATENT DOCUMENTS

2016/0189611 A1* 6/2016 Jinta .................... H01L 27/1229
345/690
2018/0337336 A1* 11/2018 Xu ....................... H01L 51/5206
(Continued)

FOREIGN PATENT DOCUMENTS

CN    104795434 A    7/2015
CN    207338380 U    5/2018
(Continued)

OTHER PUBLICATIONS

First Office Action dated Jun. 16, 2020, issued in corresponding Chinese Application No. 201910100174.8, filed Jan. 31, 2019, 17 pages.

*Primary Examiner* — Nduka E Ojeh
(74) *Attorney, Agent, or Firm* — Christensen O'Connor Johnson Kindness PLLC

(57) ABSTRACT

Provided is a display panel having first and second display regions. The display panel includes: a base; an array portion located on base; and a light-emitting functional portion located on a side of the array portion facing away from base and including AMOLED and PMOLED light-emitting units. The AMOLED light-emitting unit is located in the first display region, the PMOLED light-emitting unit is located in the second display region, and the second display region is surrounded or partially surrounded by the first display region. The PMOLED and AMOLED light-emitting units each include an anode, and the anode of the PMOLED light-emitting unit has an area smaller than that of the AMOLED light-emitting unit; and/or, the display panel further includes a transparent carrier substrate located on a side of the light-emitting functional portion facing away from the base, and the PMOLED light-emitting unit has at least one film layer carried thereby.

21 Claims, 12 Drawing Sheets

(52) U.S. Cl.
CPC ...... *H01L 27/3262* (2013.01); *H01L 27/3288* (2013.01); *H01L 51/5228* (2013.01); *H01L 27/1214* (2013.01); *H01L 2227/323* (2013.01)

(56) References Cited

U.S. PATENT DOCUMENTS

| | | | |
|---|---|---|---|
| 2020/0052059 A1* | 2/2020 | Chen | H01L 27/3213 |
| 2020/0335035 A1* | 10/2020 | Gai | G09G 3/325 |
| 2020/0335576 A1* | 10/2020 | An | H01L 51/5275 |
| 2020/0350377 A1* | 11/2020 | Zhong | H01L 27/3227 |

FOREIGN PATENT DOCUMENTS

| | | | |
|---|---|---|---|
| CN | 108986678 A | | 12/2018 |
| CN | 110265472 A | * | 9/2019 |

* cited by examiner

DISPLAY PANEL WITH LIGHT-EMITTING FUNCTIONAL UNITS, DISPLAY DEVICE AND METHOD FOR MANUFACTURING DISPLAY PANEL

CROSS-REFERENCE TO RELATED APPLICATIONS

The present disclosure claims priority to Chinese Patent Application No. 201910100174.8, filed on Jan. 31, 2019, the content of which is incorporated herein by reference in its entirety.

TECHNICAL FIELD

The present disclosure relates to the field of display technologies, and in particular, to a display panel, a display device, and a method for manufacturing the display panel.

BACKGROUND

In the related art, in order to increase a screen occupancy ratio while avoiding a camera and a sensor, researchers have proposed a concept of a specially-shaped screen, in which a screen is hollowed out at positions of a front-facing camera and a sensor, or a notch is provided on a display panel so as to avoid components such as the front-facing camera, the sensor and the like in a display device such as a cellphone. An image cannot be displayed at a "notch" position of a "notch screen", and thus a part of the image will be missing at the "notch" position when the image is displayed. As a result, the user experience is degraded.

SUMMARY

In view of this, the present disclosure provides a display panel, a display device, and a method for manufacturing the display panel.

In an aspect, the present disclosure provides a display panel having a first display region and a second display region. The display includes: a base; an array portion located on the base; and a light-emitting functional portion located on a side of the array portion facing away from the base. The light-emitting functional portion includes an Active Matrix Organic Light Emitting Diode (AMOLED) light-emitting unit and a Passive-Matrix Organic Light Emitting Diode (PMOLED) light-emitting unit. The AMOLED light-emitting unit is located in the first display region, the PMOLED light-emitting unit is located in the second display region, and the second display region is surrounded or partially surrounded by the first display region. The PMOLED light-emitting unit includes an anode and the AMOLED light-emitting unit includes an anode, and the anode of the PMOLED light-emitting unit has an area smaller than an area of the anode of the AMOLED light-emitting unit; and/or, the display panel further includes a transparent carrier substrate located on a side of the light-emitting functional portion facing away from the base, and the PMOLED light-emitting unit has at least one film layer carried by the transparent carrier substrate.

In another aspect, the present disclosure provides a method for manufacturing a display panel. The display panel has a first display region and a second display region disposed adjacent to each other. The method for manufacturing the display panel includes: providing a base; manufacturing an array portion on a side of the base; and manufacturing a light-emitting functional portion on a side of the array portion facing away from the base. Manufacturing the light-emitting functional portion includes: manufacturing a plurality of AMOLED light-emitting units corresponding to the first display region, and manufacturing a plurality of PMOLED light-emitting units corresponding to the second display region. The method for manufacturing the display panel further includes: providing a transparent carrier substrate, and manufacturing a transparent electrode on the transparent carrier substrate; and attaching a side of the transparent carrier substrate, to which the transparent electrode is attached, to a side of the base to which the light-emitting functional portion is attached, and reusing the transparent electrode as a cathode or an anode of each of the plurality of PMOLED light-emitting units.

In still another aspect, the present disclosure provides a display device including the display panel described above.

DESCRIPTION OF EMBODIMENTS

Figure 1:
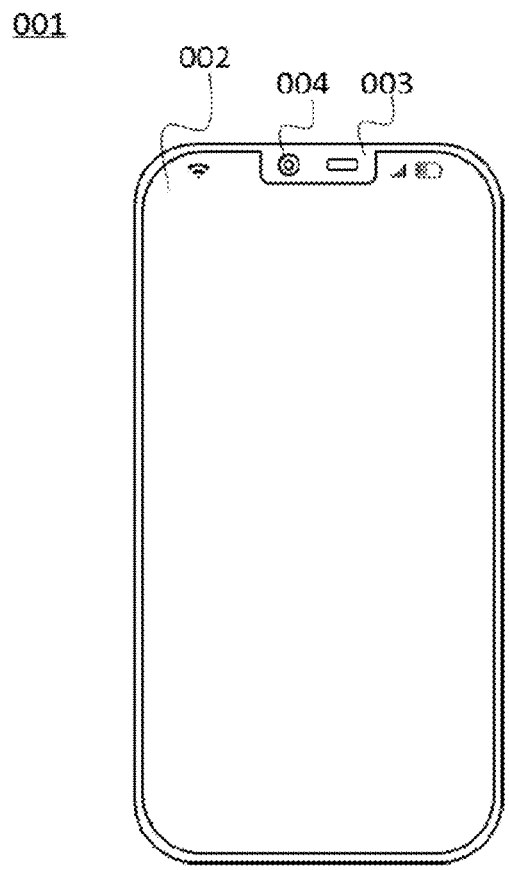
FIG. 1 illustrates a display device in the related art.

In order to make the purposes, features and advantages of the present disclosure more understandable, the present disclosure will be further described with reference to the accompanying drawings and embodiments.

It should be noted that details are provided in the following description so as to better understand the present disclosure. However, the present disclosure can be implemented in various ways other than those described herein, and those skilled in the art can make similar systems and methods without departing from the scope of the present disclosure. Therefore, the present disclosure is not limited to the embodiments disclosed herein.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be noted that, the expressions such as "upper", "lower", "left", "right" and the like mentioned in embodiments of the present disclosure are described with reference to the placement status in the accompanying drawings, and should not be construed as limiting embodiments of the present disclosure. In addition, it should also be understood that, in the context, while referring to an element being formed "above" or "below" another element, it is possible that the element is directly formed "above" or "below" the other element, it is also possible that the element is formed "above" or "below" the other element via an intermediate element. For the present disclosure and claims, expression "and/or" includes both alternatives, i.e., the conjunctive form "and" and the disjunctive form "or."

In order to make the purposes, features and advantages of the present disclosure more understandable, the present disclosure will be further described with reference to the accompanying drawings and embodiments. However, the embodiments may be implemented in many manners and should not be construed as limited to the embodiments provided herein; these embodiments are provided so that the present disclosure will be understandable, and will better deliver the concepts of the embodiments to those skilled in the art. A same reference sign in the drawings represents a same or similar structure, and thus a repetitive description thereof will be omitted. The expressions about the positions and directions in the present disclosure are all described by taking the drawings as examples, however, changes may be made if necessary, and all these changes should be included in the protection scope of the present disclosure. The drawings of the present disclosure are merely for illustrating a relative position relationship, and the layer thicknesses of some portions are exaggerated for the sake of comprehension, and the layer thicknesses in the drawings do not represent the proportional relationship of the actual layer thicknesses. The embodiments in the present disclosure and the features in the embodiments may be combined with each other. The drawings of the embodiments in the present disclosure use the same reference signs. In addition, the common feathers of the embodiments will not be repeated herein.

FIG. 1 illustrates a display device in the related art. As shown in FIG. 1, the display device 001 includes a display panel 002 for displaying an image. Due to limitation of a front-facing camera 004 and a sensor, the display panel 002 generally adopts a shape of a "notch screen". That is, at least a part of an edge of the display panel 002 is concave toward a center of the display panel 002, so that the display panel 002 forms a notch 003 at this edge. The camera 004, the sensor and the like then can be arranged at the notch 003. In this way, the notch can prevent the display panel 002 from blocking the camera 004. Herein, the notch 003 of the display panel 002 is located at the "notch" position, and the display device 001 cannot display any image at the position of the notch 003. As a result, when displaying an image (for example, when watching a movie, or playing a game, etc.), the image at the position of the "notch" will be missing. In this case, the image is not aesthetic, and the user experience is also affected.

Figure 2:
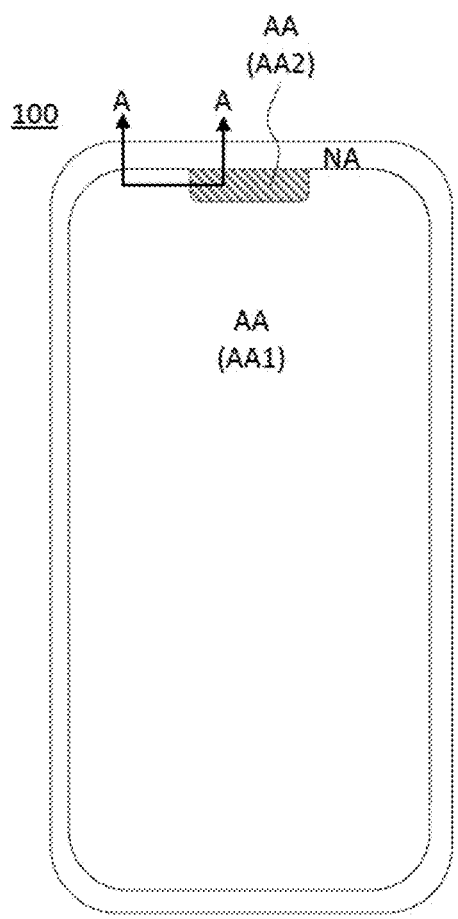
FIG. 2 is a top view of a display panel according to an embodiment of the present disclosure.
Figure 3:
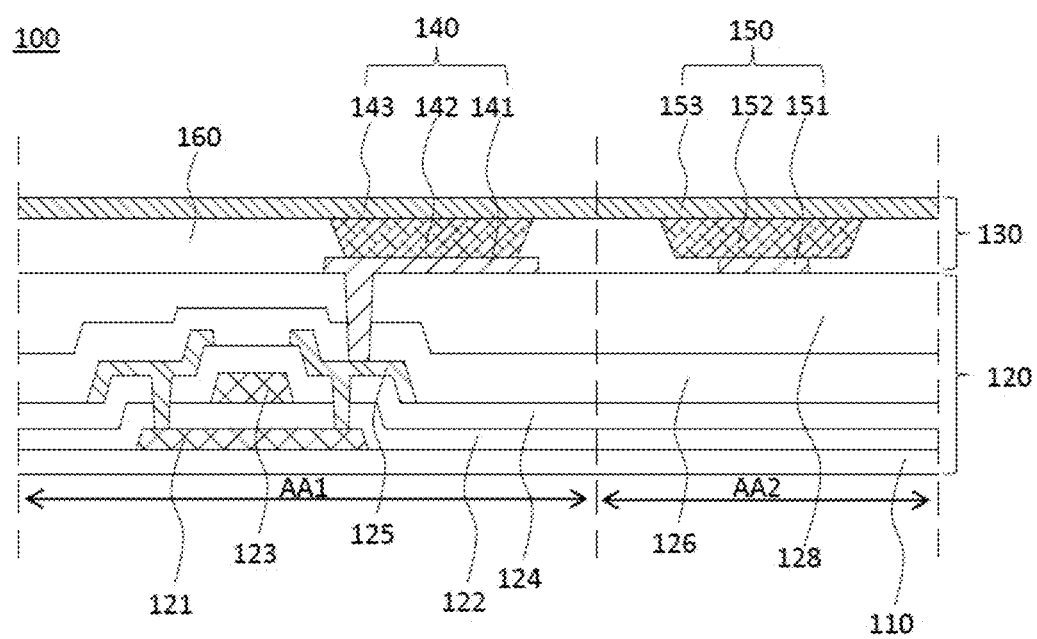
FIG. 3 is a schematic cross-sectional view along line AA of FIG. 2.
Figure 4:
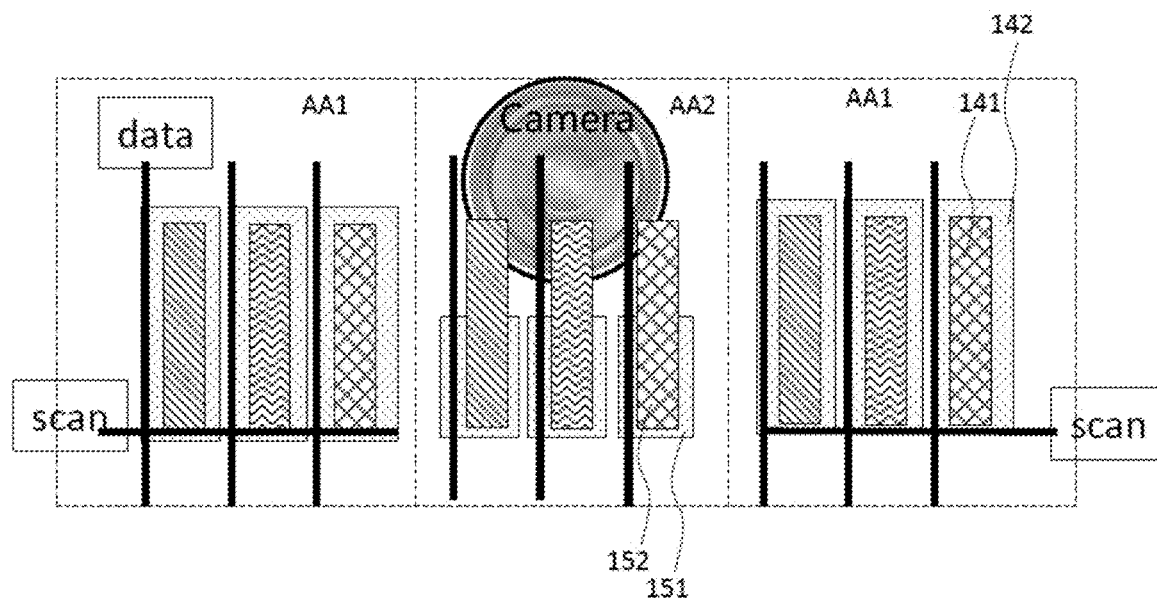
FIG. 4 is a partial enlarged top view of a display panel according to an embodiment of the present disclosure.

In view of this, an embodiment of the present disclosure provides a display panel as shown in FIG. 2 to FIG. 4. FIG. 2 is a top view of a display panel according to an embodiment of the present disclosure. FIG. 3 is a schematic cross-sectional view along line AA of FIG. 2. FIG. 4 is a partial enlarged top view of a display panel according to an embodiment of the present disclosure. For better illustrating the present embodiment, some structures in these figures are shown in a perspective or an omitted manner.

The display panel 100 has a display region AA and a non-display region NA surrounding the display region AA. The display region AA includes a first display region AA1 and a second display region AA2. The second display region AA2 is partially surrounded by the first display region AA1. A portion of the second display region AA2 that is not surrounded by the first display region AA1 is adjacent to the non-display region NA. In an example, the display region AA is shaped as a rectangle or a rounded rectangle, and the second display region AA2 is shaped as a rectangle or a rounded rectangle.

The display panel 100 includes a base 110. The base 110 may be made of a polymer material such as glass, polyimide (PI), polycarbonate (PC), polyether sulfone (PES), polyethylene terephthalate (PET), polyethylene naphthalate (PEN), polyarylate (PAR), glass fiber reinforced plastic (FRP) or the like. The base 110 may be transparent, translucent or opaque. The base 110 in this embodiment of the present disclosure may be a flexible substrate that is made of a thin polymer such as polyimide. The base may further include a buffer portion, which may include a plurality of inorganic layers and a plurality of organic layers that are stacked so as to block oxygen and moisture and thus prevent moisture or impurities from diffusing through the base. Moreover, an upper surface of the base is formed as a flat surface. The structure of the base 110 is sufficiently described and will not be further described herein by embodiments of the present disclosure.

The display panel 100 further includes an array portion 120 located on the base 110. The array portion 120 includes a plurality of thin film transistors (TFTs) and a pixel circuit formed by the thin film transistors for controlling a light-emitting device. In this embodiment of the present disclosure, a top-gate type thin film transistor is taken as an example for description of the structure. The array portion 120 includes: an active layer 121 for forming a thin film transistor; a gate insulation layer 122 located on the active layer 121; a gate electrode 123 of the thin film transistor, located on the gate insulation layer 122; an interlayer insulation layer 124 located on the gate electrode 123; and source and drain electrodes 125 of the thin film transistor located on the interlayer insulation layer 124. The active layer 121 includes a source region and a drain region formed by doping N-type impurity ions or P-type impurity ions therein, and a channel region located between the source region and the drain region. The interlayer insulation layer 124 may be formed by an insulation inorganic layer made of, e.g., silicon oxide, silicon nitride or the like, or may be formed by an insulation organic layer. The source and drain electrodes 125 are electrically connected (or coupled) to the source region and the drain region through contact holes, respectively, and the contact holes are formed by selectively removing a portion of the gate insulation layer 122 and a portion of the interlayer insulation layer 124.

In an example, the array portion 120 further includes a passivation layer 126 located on the thin film transistor. The passivation layer 126 is located on the source and drain electrodes 125. The passivation layer 126 may be formed by an inorganic layer made of, e.g., silicon oxide, silicon nitride or the like, or may be formed by an organic layer.

In an example, the array portion 120 further includes a planarization layer 128 located on the passivation layer 126. The planarization layer 128 may include an organic layer made of, e.g., acryl, polyimide (PI) or benzocyclobutene (BCB) or the like. The planarization layer 128 has a planarization function.

The display panel 100 further includes a light-emitting functional portion 130 located on a side of the array portion 120 facing away from the base 110. The light-emitting functional portion 130 includes an active matrix OLED (AMOLED) light-emitting unit 140 and a passive matrix OLED (PMOLED) light-emitting unit 150. The AMOLED light-emitting unit 140 is located in the first display region AA1, and the PMOLED light-emitting unit 150 is located in the second display region AA2.

In an example, the AMOLED light-emitting unit 140 and the PMOLED light-emitting unit 150 are arranged in an array along a row direction and a column direction on a plane of the display panel 100, so as to form an array of light-emitting units.

In an example, the AMOLED light-emitting unit 140 and the PMOLED light-emitting unit 150 each include an anode, an organic light-emitting layer, and a cathode that are stacked.

Along a direction from the base 110 toward the light-emitting functional portion 130, the AMOLED light-emitting unit 140 includes a first anode 141, a first organic light-emitting layer 142, and a first cathode 143 that are sequentially stacked, and the PMOLED light-emitting unit 150 includes a second anode 151, a second organic light-emitting layer 152, and a second cathode 153 that are sequentially stacked. For example, the first anode 141 and the second anode 151 are located in a same layer.

Herein, only a pattern of the anode 141 of the AMOLED light-emitting unit 140 is connected to the source or drain electrode of the thin film transistor through through holes in the planarization layer 128 and the passivation layer 126.

In an example, the anode of the PMOLED light-emitting unit 150 has an area smaller than that of the anode of the AMOLED light-emitting unit 140. That is, the second anode 151 has an area smaller than that of the first anode 141.

In an example, the area of the anode 151 of the PMOLED light-emitting unit 150 is 50% the area of the anode 141 of the AMOLED light-emitting unit 140.

In an example, a pixel definition layer 160 corresponding to the PMOLED light-emitting unit 150 and a pixel definition layer 160 corresponding to the AMOLED light-emitting unit 140 have the same aperture area (size).

In an example, the organic light-emitting layer of one PMOLED light-emitting unit 150 and the organic light-emitting layer corresponding to one AMOLED light-emitting unit 140 have the same area and the same pattern.

In the embodiment, the first organic light-emitting layer 142 and the second organic light-emitting layer 152 are formed by a same mask, and the first organic light-emitting layer 142 and the second organic light-emitting layer 152 have a same area.

In this way, even if the first anode 141 and the second anode 151 contain a metal material and light shielding or light reflection may occur, the second display region AA2 can have sufficient light transmittance while achieving the electrical property of the anode since the first anode 141 has an area greater than that of the second anode 151.

In addition, an effective light-emitting area of the light-emitting unit is an area of a region where the light-emitting material overlaps with the anode and the cathode. Thus, the PMOLED light-emitting unit 150 has a smaller light-emitting area than that of the AMOLED light-emitting unit 140, and the array portion 120 in the second display region AA2 includes no thin film transistor, driving circuit or the like and this region is a transparent display region. The brightness loss due to the decreased light-emitting area of the light-emitting unit can be compensated by an external light source. Therefore, the second display region AA2 can have sufficient light transmittance. In this way, interference to a photosensitive device in the second display region AA2 can be reduced, and the first organic light-emitting layer 142 and the second organic light-emitting layer 152 can be formed by using a same mask, thereby allowing the second display region AA2 to have sufficient light transmittance while simplifying the process.

It can be understood that the area, the size and the pattern of a structure mentioned herein can be understood as an area, a size and a pattern of an orthographic projection of the structure on the base.

In an example, the display panel 100 further includes a pixel definition layer 160 located on a side of the anode facing away from the base 110. The pixel definition layer 160 may be made of an organic material such as polyimide (PI), polyamide, benzocyclobutene (BCB), acryl resin or phenol resin, or may be made of an inorganic material such as SiNx. The pixel definition layer 160 includes a plurality of apertures exposing the anode. The organic light-emitting layer is at least partially filled in the aperture and contacts the anode. The organic light-emitting layer in the aperture forms a minimum light-emitting unit, and each light-emitting unit can emit light of a different color according to a different material of the organic light-emitting layer. Each light-emitting unit communicates with the pixel circuit to form a pixel, and a plurality of pixels jointly performs displaying of an image.

It should be noted that in other embodiments of the present disclosure, when the area of the second anode is 50% of the area of the first anode or less, the aperture area of the pixel definition layer in the second display region is 50% of the aperture area of the pixel definition layer in the first display region or less. In this case, the area of the second organic light-emitting layer 152 is 50% of the area of the first organic light-emitting layer 142 or less, so that the transmittance of the second display region can be further improved.

In an example, the organic light-emitting layer can be formed in the aperture of the pixel definition layer by inkjet printing, nozzle printing, or evaporation or the like. The cathode is located on a side of the organic light-emitting layer facing away from the base, and can be formed on the organic light-emitting layer by evaporation. In an example, the whole side of the cathode covers the organic light-emitting layer and the pixel definition layer. In this embodiment, the cathode of the AMOLED light-emitting unit 140 and the cathode of the PMOLED light-emitting unit 150 are in a same film layer.

In an example, the display panel may further include a hole transport layer and an electron transport layer (not shown). The hole transport layer is located on a side of the anode facing away from the base, the organic light-emitting layer is located on a side of the hole transport layer facing away from the anode, and the electron transport layer is located on a side of the organic light-emitting layer facing away from the hole transport layer. The hole transport layer is located between the anode and the organic light-emitting layer so as to improve capability of the anode for hole injecting and hole transporting to the organic light-emitting layer. The electron transport layer is located between the organic light-emitting layer and the cathode so as to improve capability of the cathode for electron injecting and electron transporting to the organic light-emitting layer. In this way, a large amount of holes and electrons can be injected into the organic light-emitting layer, thereby improving recombination efficiency and achieving an effect of improving the light-emitting efficiency of the organic light-emitting layer. In another example, the display panel may further include a hole injection layer and an electron injection layer (not shown). The hole injection layer is located on a side of the hole transport layer facing away from the organic light-emitting layer, i.e., being located between the anode and the hole transport layer. The electron injection layer is located on a side of the electron transport layer facing away from the organic light-emitting layer, i.e., being located between the cathode and the electron transport layer.

The AMOLED light-emitting unit 140 uses an individual thin-film transistor to control each pixel, and each pixel can be continuously and independently driven to emit light. The PMOLED light-emitting unit 150 forms a matrix by a cathode and an anode, and illuminates pixels in the array in a scanning manner. Since there is no need to provide pixel driving circuits in the display region corresponding to the PMOLED light-emitting units 150 in one-to-one correspondence, there is no need to provide a thin film transistor and a metal trace in the array portion in the second display region AA2, thereby increasing light transmittance of the second display region AA2. In this way, the second display region AA2 can have a light transmission function while an image is normally displayed in the second display region AA2, thereby improving the feeling of the user using the cellphone.

In this embodiment, the thin film transistor in the array portion in the second display region is removed without changing mask of the existing organic light-emitting layer, and the area of the anode in the second display region is reduced. This can simplify manufacturing process while achieving high light transmittance for the camera region (the second display region), thereby achieving full-screen display and improving the display effect.

Figure 5:
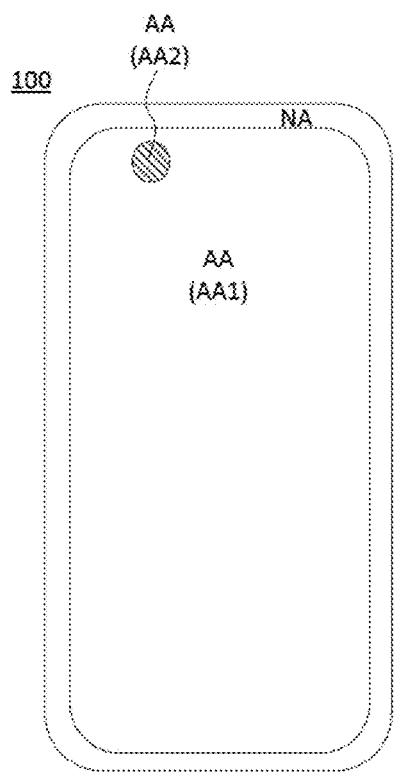
FIG. 5 is a top view of another display panel according to an embodiment of the present disclosure.

FIG. 5 is a top view of another display panel according to an embodiment of the present disclosure. In an example of the present disclosure, as shown in FIG. 5, the display panel has a display region AA and a non-display region NA surrounding the display region AA. The first display region AA1 surrounds the second display region AA2. In the related art, the display panel is provided with an aperture so as to avoid the camera or the sensor, and the aperture is usually disposed at the edge of the display panel so as to prevent the displayed image from being greatly influenced. The user usually faces the display panel when using the display device, and thus the user cannot look directly at the camera when looking directly at the display pane if the camera is disposed at the edge of the display panel. Especially when the user takes a selfie, the user cannot see his/her own image displayed in the display panel while looking at the camera. With the display panel provided by this embodiment, there is no need to provide an aperture or a notch in the display panel for avoidance, and the camera can be disposed at a position close to a center of the display panel without affecting displaying of the image, so that the user can look directly at the display panel and the camera at the same time.

Figure 6:
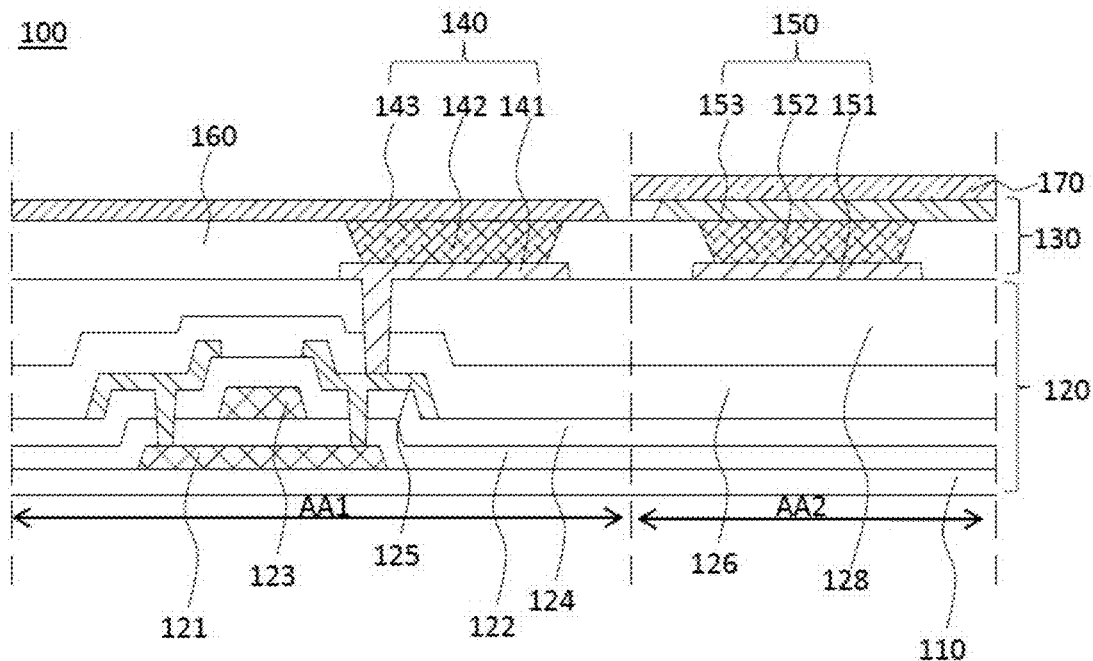
FIG. 6 is a schematic cross-sectional view of another display panel along line AA of FIG. 2 according to an embodiment of the present disclosure.

FIG. 6 is a schematic cross-sectional view of another display panel along line AA of FIG. 2 according to an embodiment of the present disclosure. In another embodiment of the present disclosure, as shown in FIG. 2 and FIG. 6, it differs from the above embodiment in that the second anode 151 and the first anode 141 have a same area.

In an example, the display panel 100 further includes a transparent carrier substrate 170 located on a side of the light-emitting functional portion 130 facing away from the base 110. At least one film layer of the PMOLED light-emitting unit 150 is carried by the transparent carrier substrate 170.

In an example, the second cathode 153 of the PMOLED light-emitting unit 150 is attached to the transparent carrier substrate 170, that is, at least the cathode of the PMOLED light-emitting unit 150 is carried by the transparent carrier substrate 170.

In an example, the first cathode 143 of the AMOLED light-emitting unit 140 is made of a metal material or MgAg, and the second cathode 153 is made of a transparent electrode such as transparent indium thin oxide (ITO).

In an example, the transparent carrier substrate 170 may be made of a polymer material such as glass, polyimide (PI), polycarbonate (PC), polyether sulfone (PES), polyethylene terephthalate (PET), polyethylene naphthalate (PEN), polyarylate (PAR), glass fiber reinforced plastic (FRP) or the like.

In an example, the transparent carrier substrate 170 does not cover the AMOLED light-emitting unit 140.

It should be understood that "carrying" as used herein refers to performing carrying as a carrier during the formation process. For example, the expression "A carries B" or "B is carried by A" means that A is used as a carrier and B is formed on A. In this embodiment, the first cathode is carried by the transparent carrier substrate, that is, the first cathode is manufactured on the transparent carrier substrate. The array portion and the light-emitting functional portion are sequentially manufactured on the base. Then the transparent carrier substrate 170 is attached to the base 110. For example, the cathode of the PMOLED light-emitting unit 150 is attached to the organic light-emitting layer of the PMOLED light-emitting unit 150, that is, the second cathode 153 is attached to the second organic light-emitting layer 152.

In this embodiment, the first cathode contains a metal material or MgAg, which can better adjust a work function and a cavity effect of the AMOLED light-emitting unit, so that the electrical property of the light-emitting unit in the first display region can be achieved and thus the display effect can be achieved. The metal material or MgAg may cause light shielding and light reflection. In this embodiment, a transparent carrier substrate is provided, and a second cathode is separately manufactured by a material different from the material of the first cathode. For example, the second cathode is made of a transparent conductive material (for example, transparent ITO). Therefore, the light transmittance of the second display region can be increased while achieving the electrical property of the light-emitting unit, thereby achieving full-screen display and improving the display effect.

In addition, by additionally providing the transparent carrier substrate and separately manufacturing the second cathode, on the one hand, the process parameters of the second cathode can be improved and the electrical property of the second cathode can be controlled, and on the other hand, the organic light-emitting layer is sensitive to water oxygen, thereby avoiding manufacturing the cathode of a different material directly on the organic light-emitting layer, which may affect the service life of the organic light-emitting layer.

Figure 7:
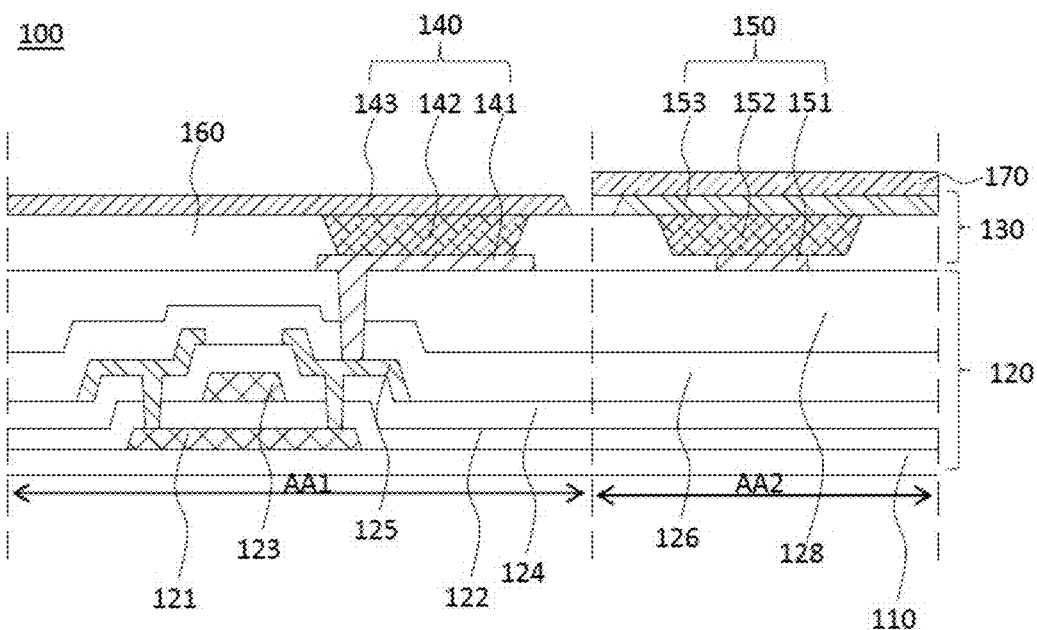
FIG. 7 is a schematic cross-sectional view of still another display panel along line AA of FIG. 2 according to an embodiment of the present disclosure.

FIG. 7 is a schematic cross-sectional view of still another display panel along line AA of FIG. 2 according to an embodiment of the present disclosure. In another embodiment of the present disclosure, as shown in FIG. 2 and FIG. 7, the anode 151 of the PMOLED light-emitting unit 150 has an area smaller than that of the anode 141 of the AMOLED light-emitting unit 140. Moreover, the display panel 100 further includes a transparent carrier substrate 170 located on a side of the light-emitting functional portion 130 facing away from the base 110. At least one film layer of the PMOLED light-emitting unit 150 is carried by the transparent carrier substrate 170.

Figure 8:
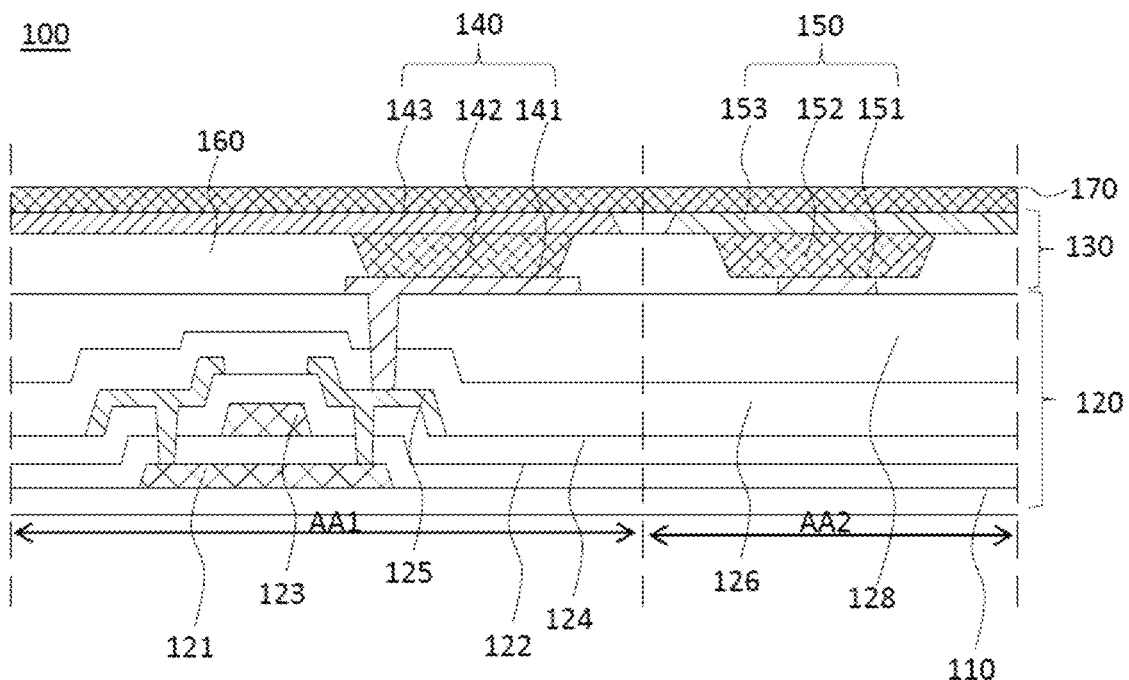
FIG. 8 is a schematic cross-sectional view of still another display panel along line AA of FIG. 2 according to an embodiment of the present disclosure.

FIG. 8 is a schematic cross-sectional view of still another display panel along line AA of FIG. 2 according to an embodiment of the present disclosure.

The AMOLED light-emitting unit 140 includes a first anode 141, a first organic light-emitting layer 142, and a first cathode 143 that are sequentially stacked.

The PMOLED light-emitting unit 150 includes a second anode 151, a second organic light-emitting layer 152, and a second cathode 153 that are sequentially stacked.

In an example, the transparent carrier substrate 170 covers both the display region AA and the non-display region NA.

In an example, the first cathode 143 and the second cathode 153 are in a layer and made of a same material. Moreover, the first cathode 143 and the second cathode 151 are both attached to the transparent carrier substrate 170. It should be understood that different filling patterns in the drawings of the embodiments of the present disclosure do not indicate different materials, and are merely for convenience of illustration.

Figure 9:
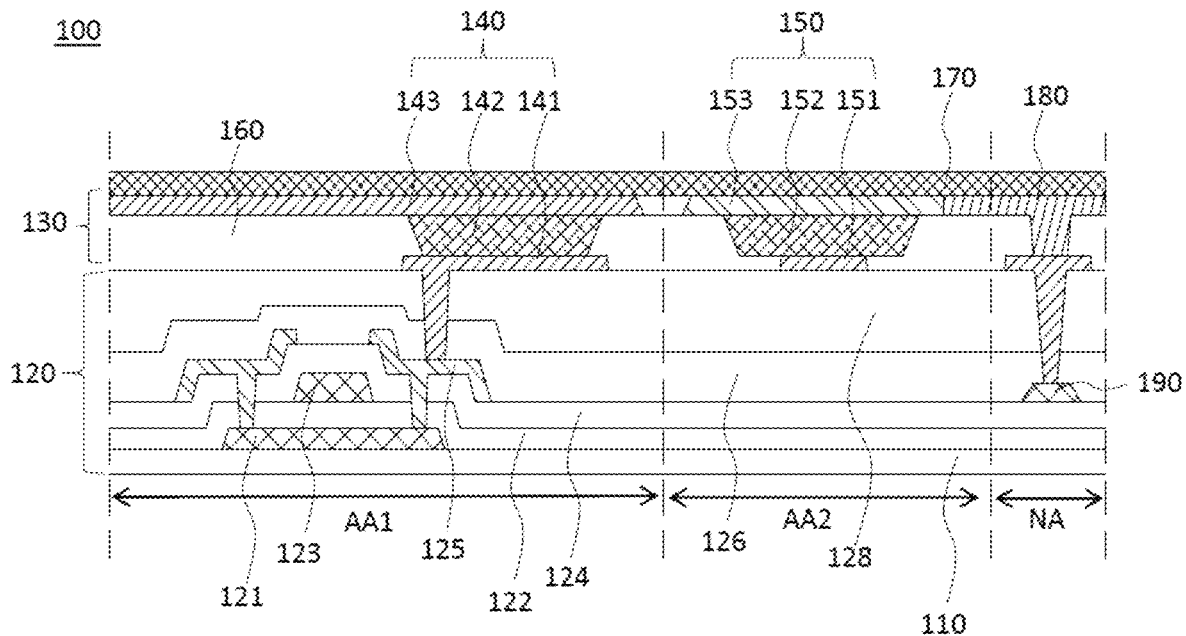
FIG. 9 is a schematic cross-sectional view of still another display panel along line AA of FIG. 2 according to an embodiment of the present disclosure.

FIG. 9 is a schematic cross-sectional view of still another display panel along line AA of FIG. 2 according to an embodiment of the present disclosure.

In an example, the transparent carrier substrate 170 covers both the display region AA and the non-display region NA.

In an example, a plurality of first transparent wires 180 is provided on the transparent carrier substrate 170, and the PMOLED light-emitting unit 150 is electrically connected to the second driving circuit 190 located in the non-display region NA through the first transparent wire 180. It should be understood that the second driving circuit 190 is not completely shown in FIG. 9. For example, a plurality of first driving circuits is not completely shown in FIG. 9, but includes the thin film transistor in FIG. 9. The first driving circuits are located in the display region AA and are connected to the AMOLED light-emitting units 1140 in one-to-one correspondence.

In this embodiment, the traces for controlling the PMOLED light-emitting unit can be manufactured on the transparent carrier substrate without occupying the array portion. The conductive film layers of the array portion are mostly metal film layers and have low light transmittance. Moreover, complicated circuit structure is provided in the array portion. In this embodiment, the array portion can have a simplified structure and the film layer thickness of the array portion can be reduced, and crosstalk between the traces of the PMOLED light-emitting unit and the driving circuit of the AMOLED light-emitting unit can also be reduced.

It should be understood that in this embodiment, there is no gap between the transparent carrier substrate 170 and the first cathode 143. Therefore, in an example, the first cathode 143 and the second cathode 153 are in a same layer and made of a same material. Moreover, the first cathode 143 and the second cathode 151 are attached to the transparent carrier substrate 170. However, in other embodiments of the present disclosure, a gap may be formed between the transparent carrier substrate 170 and the first cathode 143 as needed, that is, the transparent carrier substrate 170 does not directly contact the first cathode 143.

Figure 10:
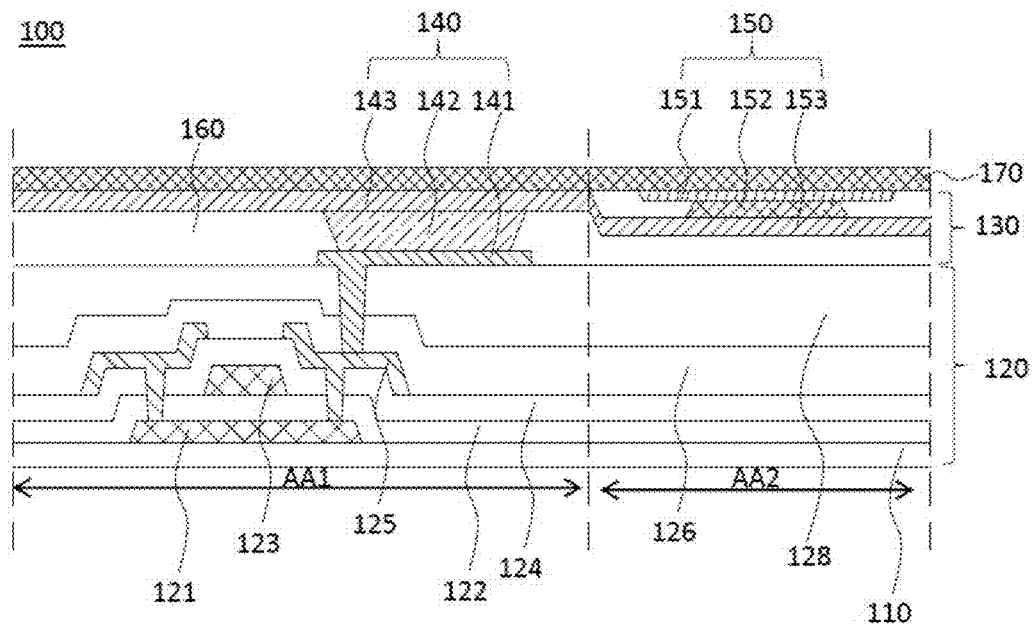
FIG. 10 is a schematic cross-sectional view of still another display panel along line AA of FIG. 2 according to an embodiment of the present disclosure.
Figure 11:
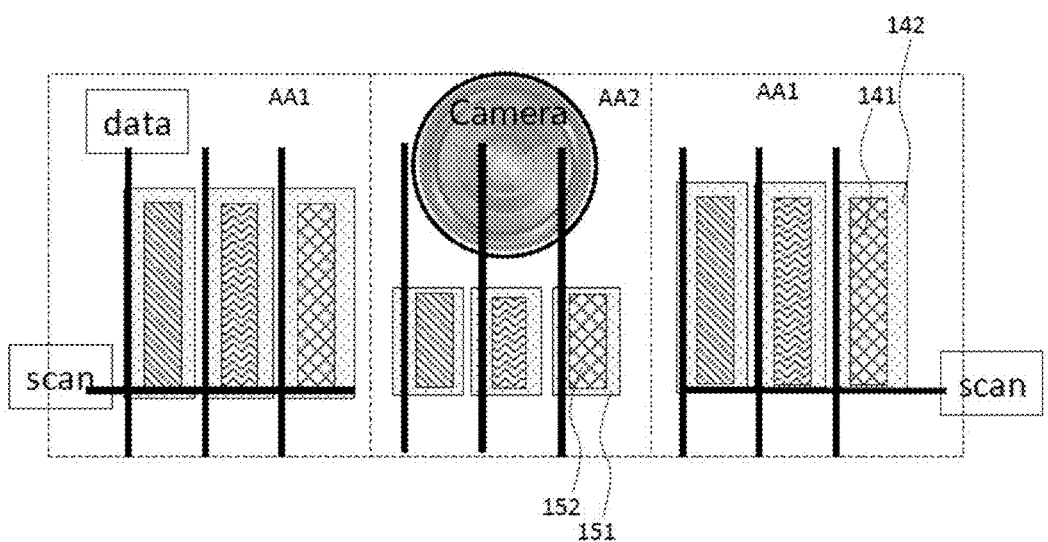
FIG. 11 is a partial enlarged top view of another display panel according to an embodiment of the present disclosure.

FIG. 10 is a schematic cross-sectional view of still another display panel along line AA of FIG. 2 according to an embodiment of the present disclosure. FIG. 11 is a partial enlarged top view of another display panel according to an embodiment of the present disclosure.

In the illustrated embodiment, the PMOLED light-emitting unit 150 includes a second cathode 153, a second organic light-emitting layer 152, and a second anode 151 that are sequentially stacked along a direction from the base 110 toward the transparent carrier substrate 170. The second anode 151 is attached to the transparent carrier substrate 170 and is a transparent electrode. That is, at least the anode of the PMOLED light-emitting unit 150 is carried by the transparent carrier substrate 170.

The AMOLED light-emitting unit 140 includes a first anode 141, a first organic light-emitting layer 142, and a first cathode 143 that are sequentially stacked. The PMOLED light-emitting unit 150 includes a second cathode 153, a second organic light-emitting layer 152, and a second anode 151 that are sequentially stacked. The first cathode 143 and the second cathode 153 are in a same layer and made of a same material.

In an example, the first anode 141 is made of a metal material or MgAg, and the second anode 151 is made of a transparent conductive material such as ITO.

In an example, the second anode 151 has an area smaller than that of the first anode 141.

In this embodiment, the first anode contains a metal material or MgAg, which can better adjust a work function and a cavity effect of the AMOLED light-emitting unit, so that the electrical property of the light-emitting unit in the first display region can be achieved and thus the display effect can be achieved. The metal material or MgAg may cause light shielding and light reflection. In this embodiment, a transparent carrier substrate may be additionally provided, and a second anode is separately manufactured by a material different from the material of the first anode. For example, the second anode is made of a transparent conductive material (for example, transparent ITO). Therefore, the light transmittance of the second display region can be increased while achieving the electrical property of the light-emitting unit.

In addition, by additionally providing the transparent carrier substrate and separately manufacturing the second anode, on the one hand, the process parameters of the second anode can be improved, and on the other hand, the organic light-emitting layer is sensitive to water oxygen, thereby avoiding manufacturing the second anode of a different material directly on the organic light-emitting layer, which may affect the service life of the organic light-emitting layer.

In an example, the first cathode 143 and the second cathode 153 are formed as a planar structure in one piece.

In another example, the first cathode 143 and the second cathode 153 are made of a metal material or MgAg.

Further, the second organic light-emitting layer 152 is carried by the second anode 151. That is, the second organic light-emitting layer 152 is attached to the second anode 151 to be formed into one piece.

In an example, the second organic light-emitting layer 152 has an area smaller than that of the first organic light-emitting layer 142.

Since the second organic light-emitting layer 152 is attached to the second anode 151 to be formed into one piece, the second organic light-emitting layer 152 having a higher precision can be separately manufactured on the transparent carrier substrate 170. Thus, the second organic light-emitting layer 152 can be patterned in a refined way and accurately aligned to form the second organic light-emitting layer 152 and the second anode 151 that are stacked. Meanwhile, the second organic light-emitting layer 152 has an area smaller than that of the first organic light-emitting layer 142, and the second display region AA2 can have a sufficient light transmittance area. Moreover, the material of the first organic light-emitting layer 142 would not be leaked into the second display region AA2 during the manufacturing of the first organic light-emitting layer 142, which would otherwise affect light emission of the second organic light-emitting layer 152 in the second display region AA2. That is, the second organic light-emitting layer 152 and the first organic light-emitting layer 142 are located in different film layers. In a direction perpendicular to the display panel, the second organic light-emitting layer 152 and the first organic light-emitting layer 142 are spaced apart from each other by the cathode. Thus, there is no crosstalk between the second organic light-emitting layer 152 and the first organic light-emitting layer 142. Moreover, only the first organic light-emitting layer is formed on the array portion, and the first anode and the first organic light-emitting layer are covered by the continuous cathode structure formed by the first and second cathodes. Therefore, this cathode can protect the formed organic light-emitting layer.

Figure 12:
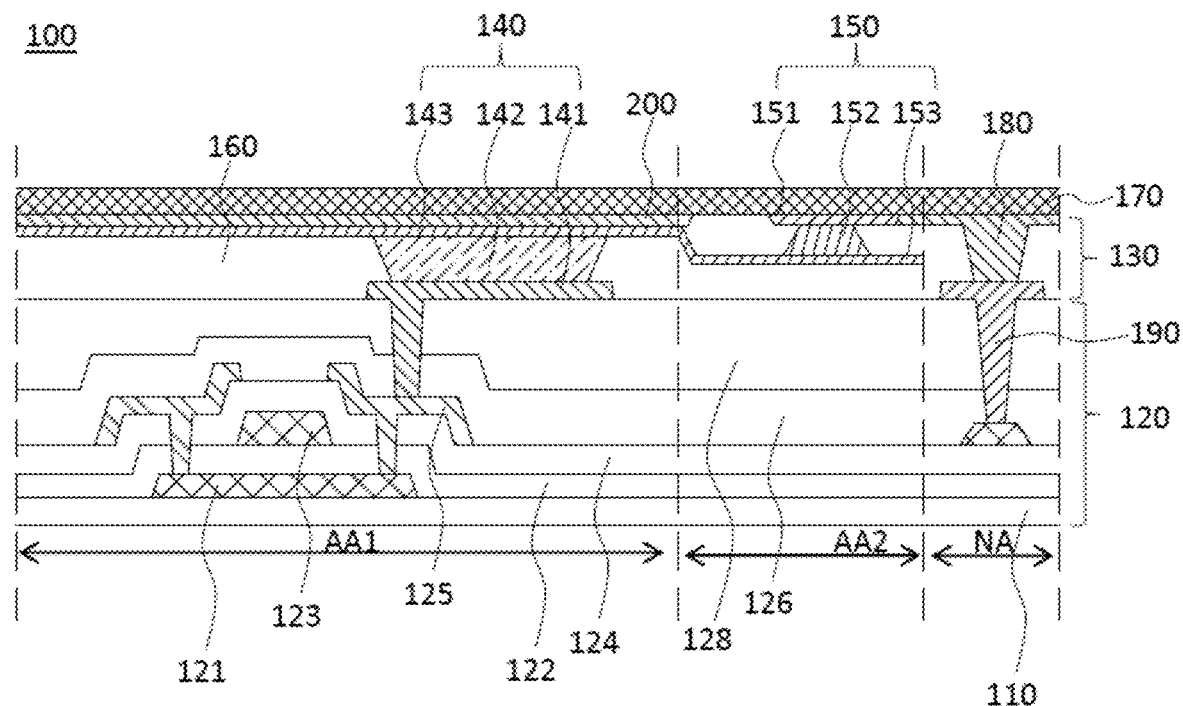
FIG. 12 is a schematic cross-sectional view of still another display panel along line AA of FIG. 2 according to an embodiment of the present disclosure.

FIG. 12 is a schematic cross-sectional view of still another display panel along line AA of FIG. 2 according to an embodiment of the present disclosure.

This embodiment differs from the above embodiment in that the transparent carrier substrate 170 covers both the display region AA and the non-display region NA, and an auxiliary conductive layer 200 is provided on a side of the transparent carrier substrate 170 facing the base. In an example, the auxiliary conductive layer 200 is located in the first display region AA1.

In an example, the auxiliary conductive layer 200 contacts the first cathode 143 and is isolated from the second anode 151.

In an example, the auxiliary conductive layer 200 and the second anode 151 are in a same layer and made of a same material.

According to this embodiment, a load of the first cathode can be reduced by the auxiliary conductive layer without addition of manufacturing process and layer thickness, thereby improving the display effect of the display panel.

In the above embodiments of the present disclosure, for example, as shown in FIG. 8, the auxiliary conductive layer is provided on the side of the transparent carrier substrate facing the base, and the auxiliary conductive layer contacts the first cathode and is isolated from the second cathode. In an example, the auxiliary conductive layer and the second cathode are in a same layer and made of a same material.

In an example, as shown in FIG. 2 and FIG. 12, a plurality of first transparent wires 180 is provided on the transparent carrier substrate 170, and the PMOLED light-emitting unit 150 is electrically connected to the second driving circuit 190 located in the non-display region NA through the first transparent wire 180. In this embodiment, the second anode 151 is connected to the first transparent wire 180. In an example, the second anode 151 and the first transparent wire 180 are in a same layer and made of a same material. In an example, the second anode 151 and the first transparent wire 180 are made of ITO.

It should be understood that the second driving circuit 190 is not completely shown in FIG. 9. In an example, a plurality of first driving circuits is not completely shown in FIG. 9, but includes the thin film transistor in FIG. 9. The first driving circuits are located in the display region AA and are connected to the AMOLED light-emitting units 1140 in one-to-one correspondence.

Figure 13:
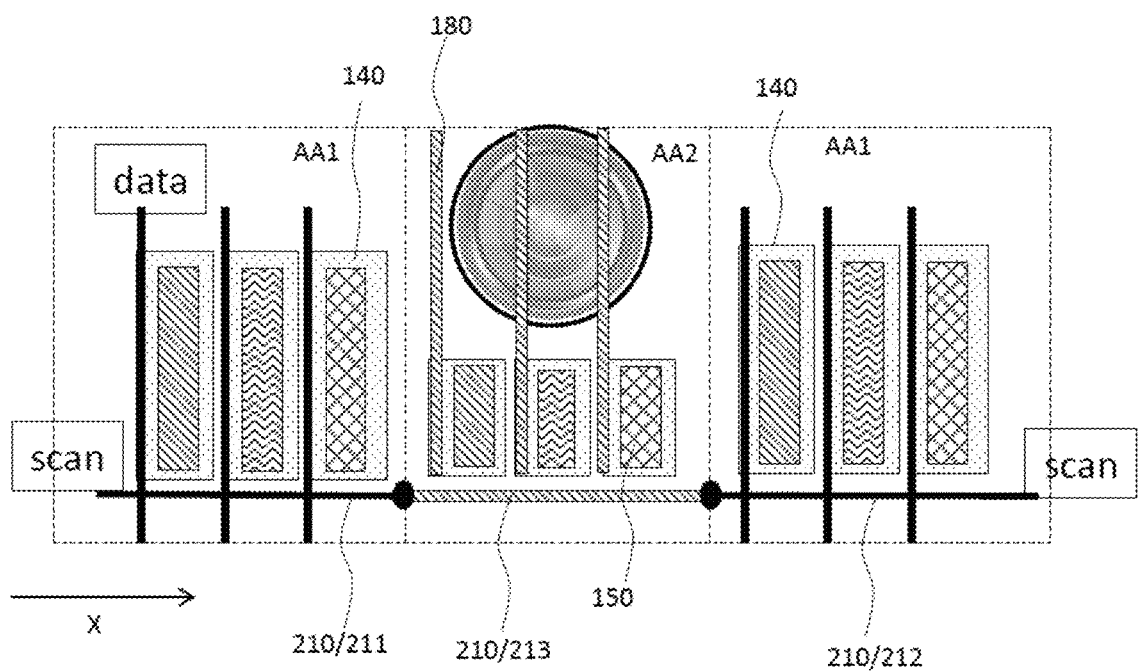
FIG. 13 is a partial enlarged top view of still another display panel according to an embodiment of the present disclosure.

FIG. 13 is a partial enlarged top view of still another display panel according to an embodiment of the present disclosure.

In this embodiment, the display panel 100 further includes a set of AMOLED light-emitting units including a plurality of AMOLED light-emitting units 140 arranged along a first direction X. At least two AMOLED light-emitting units 140 in a same set of first AMOLED light-emitting units are spaced apart from each other by a second display region AA2.

At least one first signal line 210 extending along the first direction X is provided, and the first signal line 210 includes a first section 211, a second section 212, and a connection section 213 electrically connected between the first section 211 and the second section 212.

In an example, the first signal line 210 is a scan line scan. One first signal line 210 is electrically connected to all AMOLED light-emitting units 140 in one set of AMOLED light-emitting units.

The first section 211 and the second section 212 are located in the first display region AA1 and further located in the array portion. In an example, the first sub-section 211 and the second sub-segment 212 are in the same layer and made of the same material as a gate electrode or source and drain electrodes of the thin film transistor.

The connection section 213 is located in the second display region AA2 and attached to the transparent carrier substrate 170. In an example, the connection section may be in the same layer and made of the same material as one or more of the second anode, the auxiliary electrode layer, the second cathode, and the first transparent wire carried by the transparent carrier substrate as described in the above embodiments.

It can be understood that, in FIG. 13, the structure shown in the second display region AA2 (except the camera) is a structure carried by the transparent carrier substrate, and the structure shown in the first display region AA1 is the structure in the array portion and the light-emitting portion.

In this embodiment, a row direction (i.e., a direction in which the scan line scan extends) is taken as the first direction X. However, it should be understood that in other embodiments of the present disclosure, the first direction may be a column direction, i.e., a direction in which a data line data extends. Then, the first signal line is the data line.

In this embodiment, the transmittance of the second display region is increased without addition of manufacturing process and layer thickness, and signal lines in the first display region that are cut off by the second display region (a region where the camera needs to be set) are electrically connected through the connection section. This can prevent the signal line in the first display region from taking detour due to avoidance of the second display region, which causes a different density of traces and crosstalk or load difference in the signal line.

Figure 14:
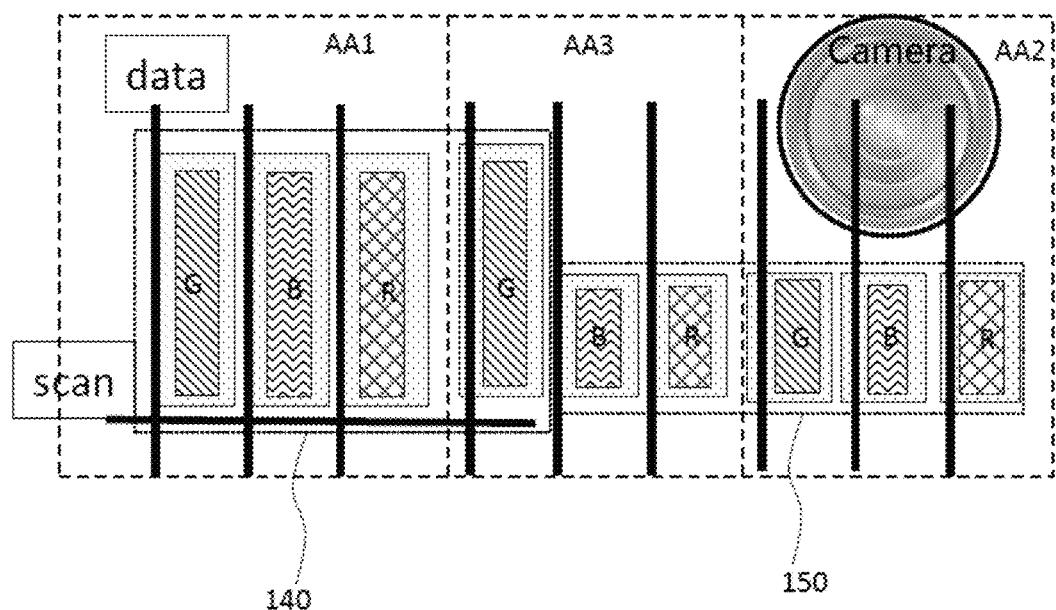
FIG. 14 is a partial enlarged top view of still another display panel according to an embodiment of the present disclosure.

FIG. 14 is a partial enlarged top view of still another display panel according to an embodiment of the present disclosure.

The display panel further includes a plurality of pixel units. The pixel unit includes a plurality of sub-pixels, and the sub-pixels are in one-to-one correspondence with the light-emitting units.

The pixel unit includes at least a green sub-pixel G, a red sub-pixel R, and a blue sub-pixel B. Brightness of the green sub-pixel G, brightness of the red sub-pixel R, and brightness of the blue sub-pixel B are separately controlled in such a manner that one pixel unit can emit light of various colors, and a plurality of pixel units that is arranged regularly jointly form a colorful image. One sub-pixel includes one light-emitting unit and may further include a pixel circuit for controlling this light-emitting unit to emit light, i.e., the second driving circuit as described above for the AMOLED light-emitting unit.

The display panel may further include a third display region AA3 located between the first display region AA1 and the second display region AA2, and the pixel unit in the third display region AA3 includes the AMOLED light-emitting unit 140 and the PMOLED light-emitting unit 150, the first display are AA1 is provided with only the AMOLED light-emitting unit 140, and the second display region AA2 is provided with only the PMOLED light-emitting unit 150.

It can be understood that, in this embodiment, only one pixel unit is respectively shown in the first display region AA1, the second display region AA2, and the third display region AA3, and each pixel unit includes sub-pixels of only three colors, which are red, green and blue. However, this is not limitation to other embodiments of the disclosure. For example, in other embodiments of the present disclosure, any number of AMOLED light-emitting units 140 and any number of PMOLED light-emitting units 150 can be arranged in the third display region.

In this embodiment, the third display region is provided for transition. In this way, a boundary can be avoided between the second display region and the first display region. Such a boundary is caused by a difference in display structure, and may be recognizable by the human eye.

With further reference to FIG. 14, the light-emitting unit corresponding to the green sub-pixel G in the third display region AA3 is the AMOLED light-emitting unit 140. It can be understood that in this embodiment, only the green sub-pixel G is the AMOLED light-emitting unit 140. In other embodiments of the present disclosure, the blue sub-pixel B in the third display region is the AMOLED light-emitting unit 140, or, the green sub-pixel G and the blue sub-pixel B are both AMOLED light-emitting units 140 and only the red sub-pixel R is the PMOLED light-emitting unit 150.

It has been found that, on the one hand, the human eye is more sensitive to green light recognition, and on the other hand, in some embodiments of the present disclosure, the second anode has an area smaller than that of the first anode since the second display region is required for sufficient transmittance. Reduction in the area of the anode leads to reduction in brightness of the light-emitting unit. Therefore, in order to avoid display difference that the human eye can recognize due to difference in the structure of the light-emitting units between the second display region and the first display region, the green pixel in the third display region is set as the AMOLED light-emitting unit. In this way, a display difference that is easier for the human eye to recognize can be avoided. Such a display difference is due to a structure difference between light-emitting units which the human eye is more sensitive to. Therefore, with this embodiment, the second display region can have improved transmittance, and the display difference recognizable by the human eye can also be weakened.

In addition, in some embodiments of the present disclosure, the anode or the cathode of the AMOLED light-emitting unit is made of a metal material or MgAg, and the anode or the cathode of the PMOLED light-emitting unit is made of transparent ITO. Compared with ITO, the metal has a smaller resistance and thus a signal generates a smaller voltage drop. Therefore, in this embodiment, the second display region can have improved transmittance, and the display difference recognizable by the human eye can also be weakened.

In some embodiments of the present disclosure, a driving current for the PMOLED light-emitting unit is greater than that for the AMOLED light-emitting unit under the premise of achieving a same display brightness. That is, in a case where the PMOLED light-emitting unit and the AMOLED light-emitting unit need to display in a same brightness, a driving current for the PMOLED light-emitting unit is greater than that for the AMOLED light-emitting unit.

In an example, a channel width-to-length ratio (i.e., W/L) of a driving transistor in the second driving circuit for driving the PMOLED light-emitting unit is greater than a channel width-to-length ratio of a driving transistor in the first driving circuit for driving the AMOLED light-emitting unit.

In another example, for a same display brightness requirement, a voltage difference between PVDD and PVEE in the second driving circuit for driving the PMOLED light-emitting unit is set to be greater than a voltage difference between PVDD and PVEE in the first driving circuit for driving the AMOLED light-emitting unit.

It has been found that in some embodiments of the present disclosure, the second anode has an area smaller than that of the first anode since the second display region is required for sufficient transmittance. Reduction in the area of the anode leads to reduction in brightness of the light-emitting unit. In addition, in some embodiments of the present disclosure, the anode or cathode of the AMOLED light-emitting unit is made of a metal material or MgAg, and the anode or cathode of the PMOLED light-emitting unit is made of transparent ITO. Compared with ITO, the metal has a smaller resistance and thus a signal generates a smaller voltage drop. In this embodiment, the second display region can have improved transmittance, and compensation can be implemented by the circuit and the driving signal. The operation is convenient, thereby facilitating structure stability of the display panel.

Figure 15:
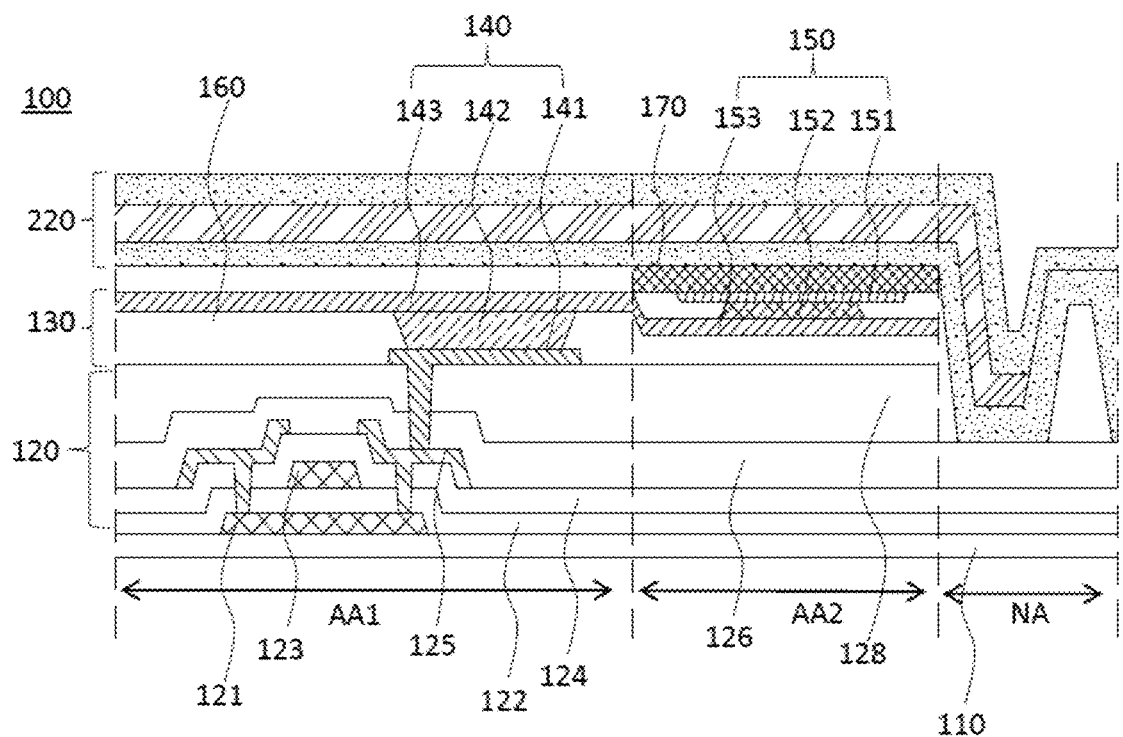
FIG. 15 is a schematic cross-sectional view of still another display panel along line AA of FIG. 2 according to an embodiment of the present disclosure.

FIG. 15 is a schematic cross-sectional view of still another display panel along line AA of FIG. 2 according to an embodiment of the present disclosure.

The display panel 100 is a flexible display panel. The display panel 100 further includes a thin film encapsulation portion 220 located on a side of the light-emitting functional portion 130 facing away from the array portion 120. The thin film encapsulation portion 220 completely covers the light-emitting functional portion 130, and also covers the transparent carrier substrate 170, so as to seal the light-emitting functional portion 130.

In an example, the thin film encapsulation portion includes a first inorganic encapsulation layer, a first organic encapsulation layer, and a second inorganic encapsulation layer that are sequentially stacked along a direction facing away from the base. It should be noted that in other embodiments of the present disclosure, the encapsulation portion may include any number of organic materials and inorganic materials that are stacked as needed. However, the encapsulation portion includes at least one layer of an organic material and at least one layer of an inorganic material that are alternately deposited, and the lowermost layer and the uppermost layer are made of inorganic materials.

In an example, the thin film encapsulation portion 220 is made of a flexible material; and the transparent carrier substrate 170 is made of a rigid material, or the transparent carrier substrate 170 is made of a flexible material, but the transparent carrier substrate 170 has a greater hardness than that of the thin film encapsulation portion 220.

In an example, the transparent carrier substrate 170 covers only the second display region AA2.

In this embodiment, the second display region has increased transmittance, while full-screen display can be achieved and the display effect can be improved by the rigid transparent carrier substrate. Moreover, the rigid transparent carrier substrate covers only the second display region, which can achieve the overall bending property of the display panel while protecting a sensor corresponding to the second display region, e.g., protecting the camera.

In should be noted that in some embodiments of the present disclosure, the thin film encapsulation portion is made of a flexible material, and the transparent carrier substrate is also made of a flexible material. In an example, the flexible transparent carrier substrate covers the first display region and the second display region.

It should be noted that in some embodiments of the present disclosure, the transparent carrier substrate may be made of a rigid material, such as glass. The transparent carrier substrate can be reused as a protective cover or an encapsulation cover.

Figure 16:
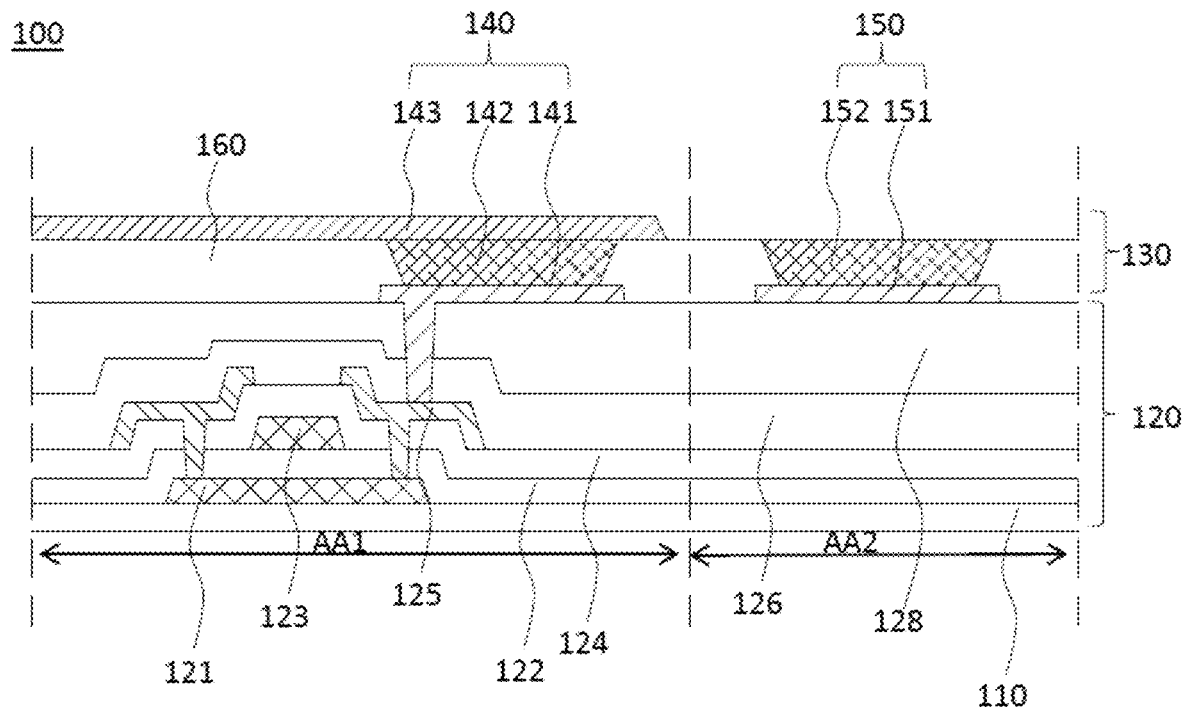
FIG. 16 to FIG. 18 are schematic diagrams illustrating a manufacturing process of a display panel according to an embodiment of the present disclosure.
Figure 17:
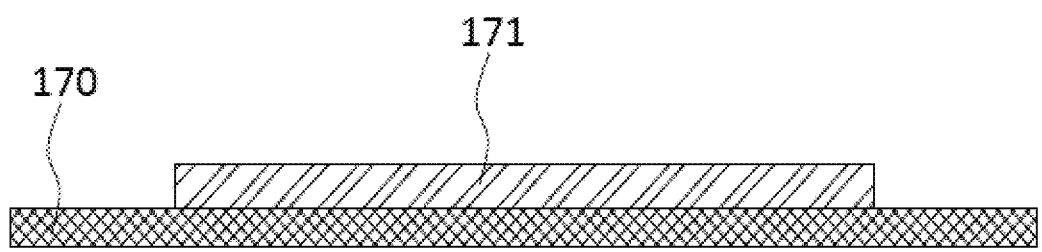
Figure 18:
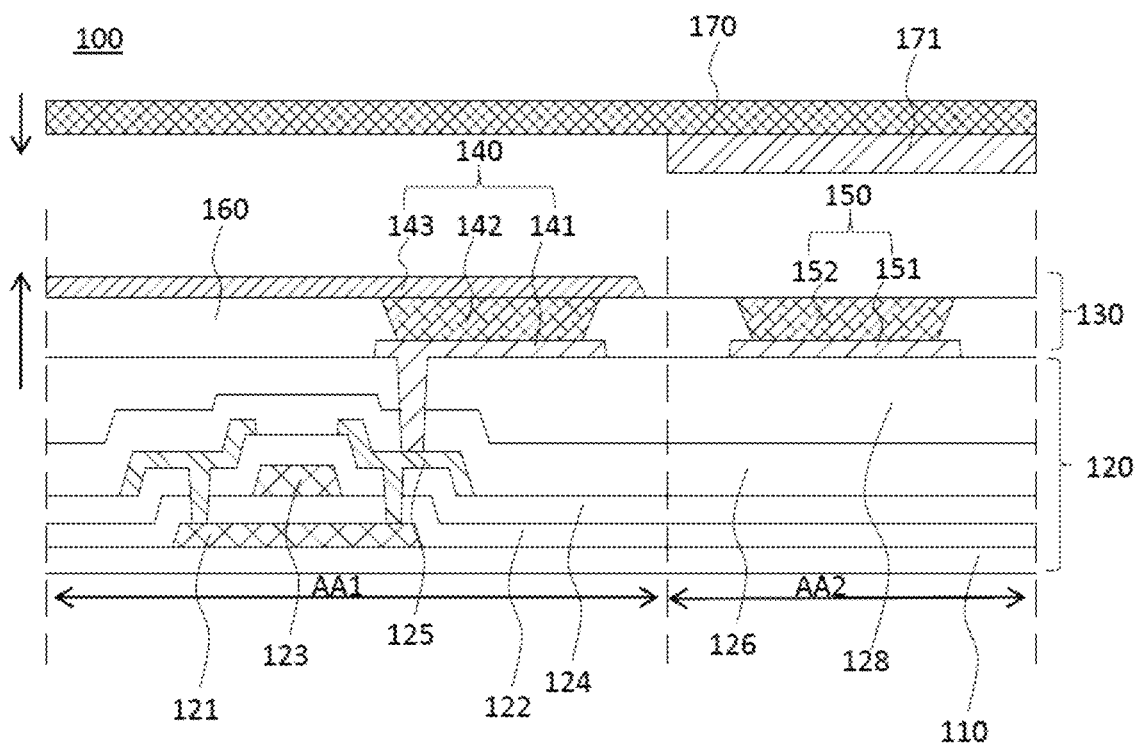

FIG. 16 to FIG. 18 are schematic diagrams illustrating a manufacturing process of a display panel according to an embodiment of the present disclosure.

In this embodiment, the display panel to be manufactured has a first display region AA1 and a second display region AA2 that are disposed adjacent to each other.

The manufacturing method provided in this embodiment includes following steps.

A base is provided. A region corresponding to the first display region AA1 and a region corresponding to the second display region AA2 in the base 110 are preset when the display panel is being manufactured.

An array portion 120 is manufactured on a side of the base 110.

A light-emitting functional portion 130 is manufactured on a side of the array portion 120 facing away from the base 110.

Manufacturing the light-emitting functional portion 130 includes manufacturing a plurality of AMOLED light-emitting units 140 corresponding to the first display region AA1 and manufacturing a plurality of PMOLED light-emitting units 150 corresponding to the second display region AA2.

Then, a transparent carrier substrate 170 is provided, and a transparent electrode 171 is manufactured on the transparent carrier substrate 170.

A side of the transparent carrier substrate 170, to which the transparent electrode 171 is attached, is attached to a side of the base 110 to which the light-emitting functional portion 130 is attached. The transparent electrode 171 is reused as a cathode i.e., a first cathode 153, of the PMOLED light-emitting unit.

Manufacturing the light-emitting functional portion 130 includes the following steps.

An anode (i.e., a first anode 141) of the AMOLED light-emitting unit 141 is formed and an anode (i.e., a second anode 151) of the PMOLED light-emitting unit 150 is formed.

In an example, a conductive pattern is formed on the array portion 120.

In an example, the conductive pattern contains a metal material so as to improve the electrical property of the light-emitting unit.

The conductive pattern is then patterned to form a first anode 141 located in the first display region AA1 and a second anode 151 located in the second display region AA2.

In an example, the first anode 141 has an area greater than that of the second anode 151.

In an example, the area of the second anode 151 is 50% the area of the first anode 141.

Then, an organic light-emitting layer (i.e., a first organic light-emitting layer 142) of the AMOLED light-emitting unit 141 and an organic light-emitting layer (i.e., a second organic light-emitting layer 152) of the PMOLED light-emitting unit 151 are formed. In an example, the first organic light-emitting layer 142 and the second organic light-emitting layer 152 are formed by using a same mask, and thus the first organic light-emitting layer 142 and the second organic light-emitting layer 152 have a same area. In this case, even if the first anode 141 and the second anode 151 contain a metal material and light shielding or light reflection may occur, since the area of the first anode 141 is greater than the area of the second anode 151, the electrical property of the anode can be achieved and the second display region AA2 has sufficient light transmittance. Moreover, an effective light-emitting area of the light-emitting unit is an area of a region where the light-emitting material overlaps with the anode and the cathode. Therefore, the light-emitting area of the PMOLED light-emitting unit 150 is smaller than the light-emitting area of the AMOLED light-emitting unit 140. The array portion 120 in the second display region AA2 is not provided with components such as a thin film transistor and a driving circuit, and this region is a transparent display region. The brightness loss due to the decreased light-emitting area can be compensated by an external light source. In this way, the second display region AA2 can have sufficient light transmittance, and interference to a photosensitive device in the second display region AA2 can be reduced. The first organic light-emitting layer 142 and the second organic light-emitting layer 152 can be formed by using a same mask, thereby allowing the second display region AA2 to have sufficient light transmittance while simplifying the process.

Then, a cathode (i.e., a first cathode 143) of the AMOLED light-emitting unit 140 is formed. In the example, the first cathode 143 is made of MgAg. In an example, the cathode of the AMOLED light-emitting unit is patterned to make the cathode of the AMOLED light-emitting unit to expose the second display region.

Forming the transparent electrode 171 on the transparent carrier substrate 170 includes: forming a second cathode 153 of the PMOLED light-emitting unit 151 on the transparent carrier substrate 170. In an example, a transparent conductive layer, such as a transparent ITO layer, is formed on the transparent carrier substrate 170, and then the transparent conductive layer is patterned to form the transparent electrode 171. In an example, the transparent electrode is located in the second display region AA2, exposing the first display region AA1, and the pattern is formed on a whole surface and the area thereof can cover all second organic light-emitting layers 152 in the second display region AA2.

It can be understood that, the step of forming a transparent electrode on the transparent carrier substrate and the step of forming an array portion and a light-emitting functional portion on the base are not implemented in a particular order, but can be implemented in any order as needed.

After the above two steps are completed, the transparent carrier substrate 170 is attached to the base 110. Here, the cathode of the PMOLED light-emitting unit 150 is attached to the organic light-emitting layer of the PMOLED light-emitting unit 150, that is, the second cathode 153 is attached to the second organic light-emitting layer 152. The arrows shown in FIG. 18 merely schematically indicate relative displacement directions of the base and the transparent carrier substrate in the attaching step.

In this embodiment, the first cathode contains a metal material or MgAg, which can better adjust a work function and a cavity effect of the AMOLED light-emitting unit, so that the electrical property of the light-emitting unit in the first display region can be achieved and thus the display effect can be achieved. The metal material or MgAg may cause light shielding and light reflection. In this embodiment, a transparent carrier substrate is provided, and a second cathode is separately manufactured by a material different from the material of the first cathode. For example, the second cathode is made of a transparent conductive material (for example, transparent ITO). Therefore, the light transmittance of the second display region can be increased while achieving the electrical property of the light-emitting unit, thereby achieving full-screen display and improving the display effect.

In addition, by additionally providing the transparent carrier substrate and separately manufacturing the second cathode, on the one hand, the process parameters of the second cathode can be improved, and on the other hand, the organic light-emitting layer is sensitive to water oxygen, thereby avoiding manufacturing the cathode of a different material directly on the organic light-emitting layer, which may affect the service life of the organic light-emitting layer.

Figure 19:
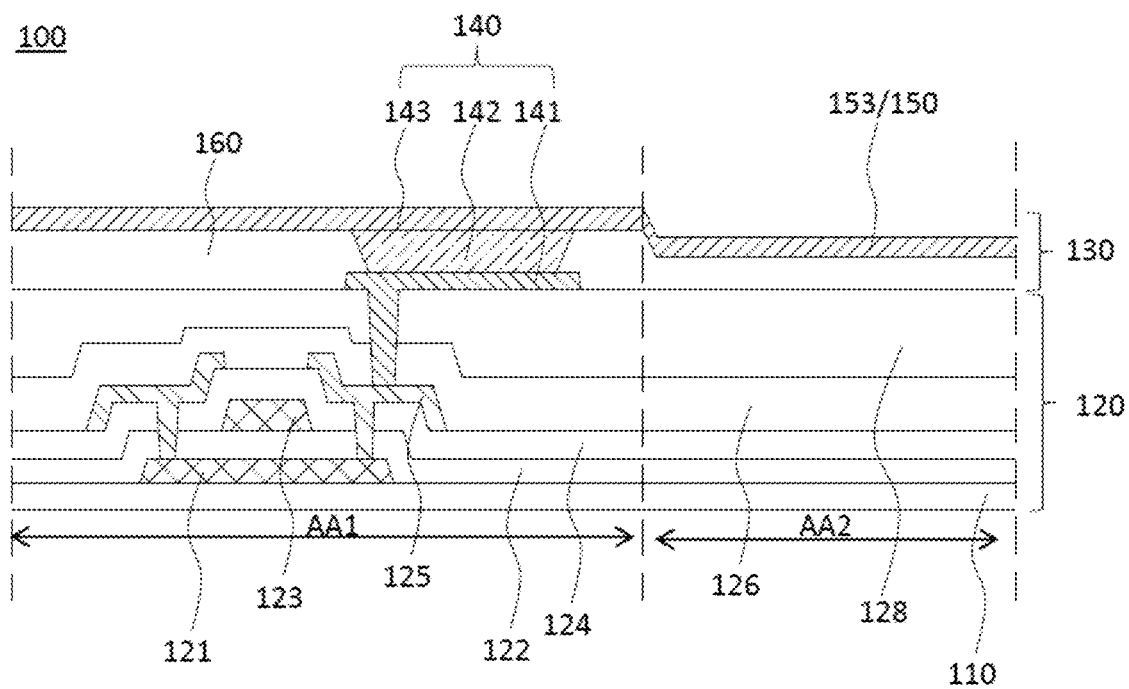
FIG. 19 to FIG. 21 are schematic diagrams illustrating a manufacturing process of another display panel according to an embodiment of the present disclosure.
Figure 20:
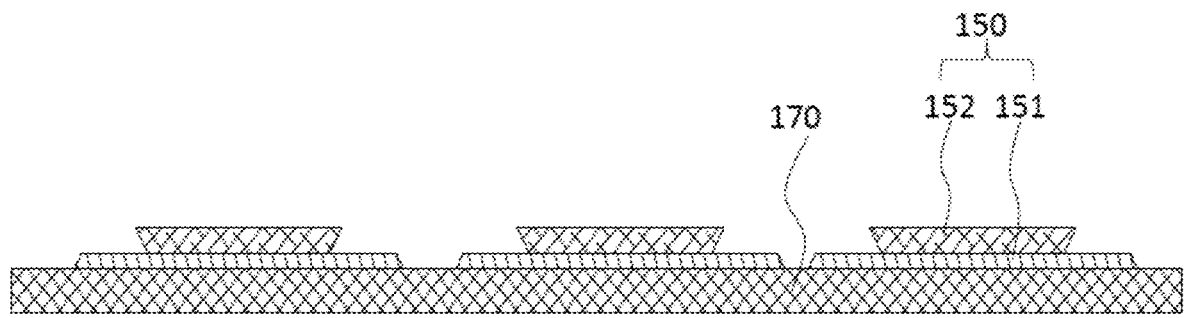
Figure 21:
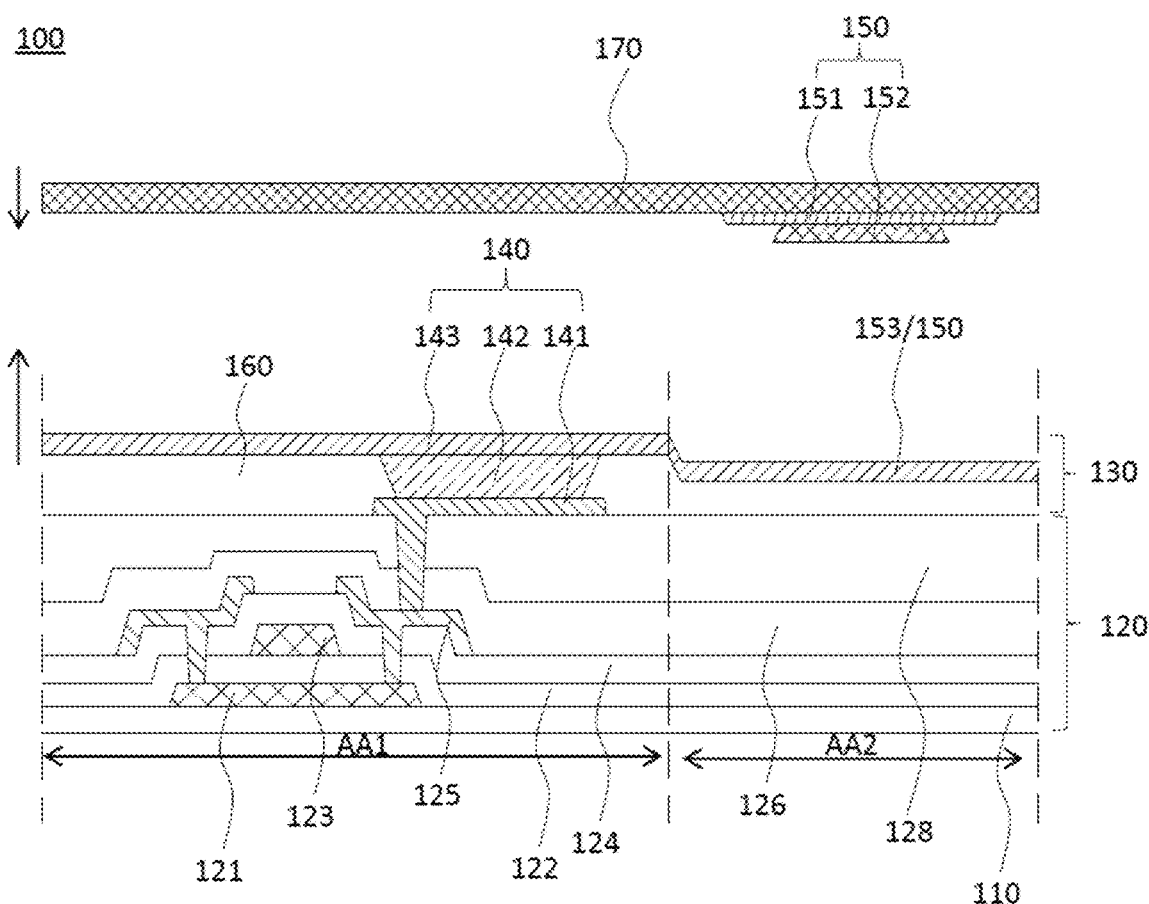

FIG. 19 to FIG. 21 are schematic diagrams illustrating a manufacturing process of another display panel according to an embodiment of the present disclosure. As shown in FIG. 19 to FIG. 21, different from the above embodiments, manufacturing the light-emitting functional portion includes: forming an anode of the AMOLED light-emitting unit; forming an organic light-emitting layer of the AMOLED light-emitting unit; and forming a cathode of the AMOLED light-emitting unit and a cathode of the PMOLED light-emitting unit in a same layer. That is, the first anode 141 and the first organic light-emitting layer 142 are sequentially formed on the array portion 120, and the anode and the organic light-emitting layer of the light-emitting unit are not formed in the second display region AA2. Then, the cathode of the light-emitting unit is formed. In an example, the first cathode 143 and the second cathode 153 are formed to be continuous.

Manufacturing the transparent electrode on the transparent carrier substrate includes: forming an anode of the PMOLED light-emitting unit on the transparent carrier substrate, and forming an organic light-emitting layer of the PMOLED light-emitting unit on a side of the anode of the PMOLED light-emitting unit facing away from the transparent carrier substrate. That is, the second anode 151 and the second organic light-emitting layer 152 are formed on the transparent carrier substrate 170. In an example, the second anode 151 is a transparent light-emitting electrode.

Attaching the transparent carrier substrate to the base includes: attaching the cathode of the PMOLED light-emitting unit to the organic light-emitting layer of the PMOLED light-emitting unit. The arrows shown in FIG. 21 merely schematically indicate relative displacement directions of the base and the transparent carrier substrate in the attaching step.

In this embodiment, the first anode contains a metal material or MgAg, which can better adjust a work function and a cavity effect of the AMOLED light-emitting unit, so that the electrical property of the light-emitting unit in the first display region can be achieved and thus the display effect can be achieved. The metal material or MgAg may cause light shielding and light reflection. In this embodiment, a transparent carrier substrate is provided, and a second anode is separately manufactured by a material different from the material of the first anode. For example, the second anode is made of a transparent conductive material (for example, transparent ITO). Therefore, the light transmittance of the second display region can be increased while achieving the electrical property of the light-emitting unit.

In addition, by additionally providing the transparent carrier substrate and separately manufacturing the second anode, on the one hand, the process parameters of the second anode can be improved, and on the other hand, the organic light-emitting layer is sensitive to water oxygen, thereby avoiding manufacturing the second anode of a different material directly on the organic light-emitting layer, which may affect the service life of the organic light-emitting layer.

In addition, the second organic light-emitting layer 152 is attached to the second anode 151 to be formed into one piece, and the second organic light-emitting layer 152 having a higher precision then can be separately manufactured on the transparent carrier substrate 170. The second organic light-emitting layer 152 can be patterned in a refine way and accurately aligned to form the second organic light-emitting layer 152 and the second anode 151 that are stacked. Meanwhile, the second organic light-emitting layer 152 has an area smaller than that of the first organic light-emitting layer 142, so that the second display region AA2 can have a sufficient light transmittance area. Moreover, the material of the first organic light-emitting layer 142 would not be leaked into the second display region AA2 during the manufacturing of the first organic light-emitting layer 142, which would otherwise affect light emission of the second organic light-emitting layer 152 in the second display region AA2. That is, the second organic light-emitting layer 152 and the first organic light-emitting layer 142 are located in different film layers. In a direction perpendicular to the display panel, the second organic light-emitting layer 152 and the first organic light-emitting layer 142 are spaced apart from each other by the cathode. Thus, there is no crosstalk between the second organic light-emitting layer 152 and the first organic light-emitting layer 142. Moreover, only the first organic light-emitting layer is formed on the array portion, and the first anode and the first organic light-emitting layer are covered by a planar cathode structure formed by the first and second cathodes. Therefore, this cathode can protect the formed organic light-emitting layer.

In an example, after forming the first anode, the method further includes: forming a pixel definition layer on the first anode, and forming an aperture passing through the pixel definition layer to expose the first anode, and then forming the first organic light-emitting layer in such a manner that the first organic light-emitting layer fills the aperture of the pixel definition layer and is in electrical contact with the first anode.

The pixel definition layer covers the first display region and the second display region. In an example, before forming the first organic light-emitting layer, the pixel definition layer is patterned in such a manner that the pixel definition layer has a smaller thickness in the second display region than in the first display region.

Thus, in the step of attaching the base to the transparent carrier substrate, a sufficient space can be left for the second organic light-emitting layer and the second anode, thereby reducing an overall thickness of the display panel.

In an example, the area of the second anode is 50% of the area of the first anode or less. An area of the aperture of the pixel definition layer in the second display region is 50% of an area of the aperture of the pixel definition layer in the first display region or less.

In some other embodiments of the present disclosure, the manufacturing method further includes: attaching a side of the transparent carrier substrate, to which the transparent trace is attached, to a side of the base to which the light-emitting functional portion is attached, so that the PMOLED light-emitting unit contacts the transparent trace.

After providing the transparent carrier substrate, the transparent trace is formed on the transparent carrier substrate. In an example, the trace is made of a transparent ITO material.

In this embodiment, the traces for controlling the PMOLED light-emitting unit can be formed on the transparent carrier substrate without occupying the array portion. The conductive film layers of the array portion are mostly metal film layers and the light transmittance is low. Moreover, a complicated circuit structure is disposed in the array portion. With this embodiment, the array portion can have a simplified structure and the film layer thickness of the array portion can be reduced. Moreover, crosstalk between the traces of the PMOLED light-emitting unit and the driving circuit of the AMOLED light-emitting unit can also be reduced.

In some other embodiments of the present disclosure, the manufacturing method further includes: proving a transparent carrier substrate, and forming an auxiliary conductive layer on the transparent carrier substrate.

In this embodiment, a load of the first cathode can be reduced by the auxiliary conductive layer without addition of manufacturing process and layer thickness, thereby improving the display effect of the display panel. Moreover, this can avoid a short circuit caused by collision between the base substrate and the first cathode in the attaching step.

Figure 22:
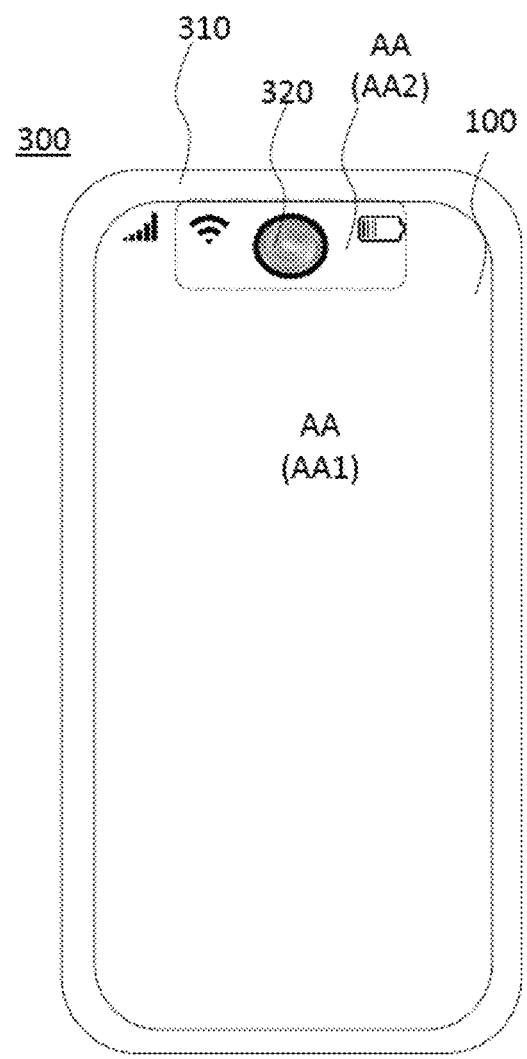
FIG. 22 is a schematic diagram of a display device according to an embodiment of the present disclosure.

An embodiment of the present disclosure further provides a display device. FIG. 22 is a schematic diagram of a display device according to an embodiment of the present disclosure.

The display device 300 includes the display panel 100 described above.

The display device 300 further includes a back plate 310 located on a back side of the display panel 100.

Other auxiliary components of the display device such as a casing for protecting the display panel, an inductive-pen, a camera and the like will not be further described herein in this embodiment.

The display device 300 further includes a camera 320.

Taking the camera as an example, in a direction perpendicular to a plane of the display panel 100, the camera 320 is located between the back plate 310 and the display panel. The camera 320 is located within a projection of the second display region AA2 in a direction perpendicular to the display panel 100.

It can be understood that the display device 300 may be an organic light-emitting diode (OLED) display device, a quantum dot light-emitting diode (QLED) display device, or a micro light-emitting diode (micro LED) display device, which will not be limited herein by embodiments of the present disclosure. The display device may also be any OLED display device, such as a cellphone, a television, a tablet computer, a smart watch, an electronic paper, a vehicle display terminal, or the like.

In some embodiments of the present disclosure, the display device further includes a sensor (not shown), and at least one sensor further meets the above-described setting requirements for the camera. The sensor may be an optical sensor, a lens, an earpiece, a loudspeaker, a fingerprint recognition device, or the like.

The above description is for better illustrating the present disclosure in connection with the preferred embodiments, which shall not be understood as limitation to the present disclosure. Some modifications and substitutions may be made by those skilled in the art without departing from the concept of the present disclosure, all of which shall be within the scope of the present disclosure.

What is claimed is:

1. A display panel, having a first display region and a second display region, wherein the display panel comprises:
   a base;
   an array portion located on the base; and
   a light-emitting functional portion located on a side of the array portion facing away from the base, the light-emitting functional portion comprising an Active Matrix Organic Light Emitting Diode (AMOLED) light-emitting unit and a Passive Matrix Organic Light Emitting Diode (PMOLED) light-emitting unit,
   wherein the AMOLED light-emitting unit is located in the first display region, the PMOLED light-emitting unit is located in the second display region, and the second display region is surrounded or partially surrounded by the first display region,
   wherein the AMOLED light-emitting unit comprises a first anode and a first cathode, the PMOLED light-emitting unit comprises a second anode and a second cathode, and the second anode of the PMOLED light-emitting unit has an area smaller than an area of the first anode of the AMOLED light-emitting unit;
   wherein the display panel further comprises a transparent carrier substrate located on a side of the light-emitting functional portion facing away from the base, and the PMOLED light-emitting unit has at least one film layer carried by the transparent carrier substrate, and
   wherein an auxiliary conductive layer is provided on a side of the transparent carrier substrate facing the base, and the auxiliary conductive layer contacts the first cathode of the AMOLED light-emitting unit and is isolated from the second cathode or the second anode of the PMOLED light-emitting unit.

2. The display panel according to claim 1, wherein the PMOLED light-emitting unit further comprises a second organic light-emitting layer, wherein the second anode, the second organic light-emitting layer, and the second cathode are sequentially stacked along a direction from the base toward the transparent carrier substrate; and wherein the second cathode is carried by the transparent carrier substrate, and the second cathode is a transparent electrode.

3. The display panel according to claim 2, wherein a first transparent wire is provided on the transparent carrier substrate, the PMOLED light-emitting unit is electrically connected to a second driving circuit through the first transparent wire, and the second driving circuit is located in the non-display region.

4. The display panel according to claim 2, wherein the AMOLED light-emitting unit further comprises a first organic light-emitting layer, and the first anode, the first organic light-emitting layer, and the first cathode are sequentially stacked along the direction from the base toward the transparent carrier substrate; and wherein the first cathode and the second cathode are located in a same layer.

5. The display panel according to claim 2, further comprising:

at least one set of AMOLED light-emitting units comprising a plurality of AMOLED light-emitting units arranged along a first direction, wherein at least two AMOLED light-emitting units in one set of AMOLED light-emitting units are spaced apart from each other by the second display region; and at least one first signal line extending along the first direction, wherein each of the at least one first signal line comprises a first section, a second section, and a connection section electrically connected between the first section and the second section, the first section and the second section are located in the first display region and further located in the array portion, and the connection section is located in the second display region and attached to the transparent carrier substrate; and wherein one of the at least one first signal line is electrically connected to all AMOLED light-emitting units in one set of AMOLED light-emitting units.

6. The display panel according to claim 1, wherein the PMOLED light-emitting unit further comprises a second organic light-emitting layer, wherein the second cathode, the second organic light-emitting layer, and the second anode are sequentially stacked along a direction from the base toward the transparent carrier substrate; and wherein the second anode is carried by the transparent carrier substrate, and the second anode is a transparent electrode.

7. The display panel according to claim 6, wherein a first transparent wire is provided on the transparent carrier substrate, the PMOLED light-emitting unit is electrically connected to a second driving circuit through the first transparent wire, and the second driving circuit is located in the non-display region.

8. The display panel according to claim 6, wherein the AMOLED light-emitting unit further comprises a first organic light-emitting layer, and the first anode, the first organic light-emitting layer, and the first cathode are sequentially stacked along the direction from the base toward the transparent carrier substrate; and wherein the first cathode and the second cathode are located in a same layer.

9. The display panel according to claim 6, further comprising:

at least one set of AMOLED light-emitting units comprising a plurality of AMOLED light-emitting units arranged along a first direction, wherein at least two AMOLED light-emitting units in one set of AMOLED light-emitting units are spaced apart from each other by the second display region; and at least one first signal line extending along the first direction, wherein each of the at least one first signal line comprises a first section, a second section, and a connection section electrically connected between the first section and the second section, the first section and the second section are located in the first display region and further located in the array portion, and the connection section is located in the second display region and attached to the transparent carrier substrate; and wherein one of the at least one first signal line is electrically connected to all AMOLED light-emitting units in one set of AMOLED light-emitting units.

10. The display panel according to claim 1, further comprising a plurality of pixel units, each pixel unit comprising a plurality of sub-pixels, and each of the plurality of sub-pixels corresponds to one of the light-emitting units;

wherein the display panel further has a third display region located between the first display region and the second display region, and pixel units in the third display region comprise the AMOLED light-emitting unit and the PMOLED light-emitting unit.

11. The display panel according to claim 10, wherein each of the plurality of pixel units comprises at least a green sub-pixel, a red sub-pixel and a blue sub-pixel, and a light-emitting unit corresponding to the green sub-pixel in the third display region is the AMOLED light-emitting unit.

12. The display panel according to claim 1, wherein a driving current for the PMOLED light-emitting unit is greater than a driving current for the AMOLED light-emitting unit, and wherein the driving currents are configured to achieve a same display brightness for the PMOLED light-emitting unit and for the AMOLED light-emitting unit.

13. The display panel according to claim 1, further comprising a thin film encapsulation portion located on a side of the light-emitting functional portion and a side of the transparent carrier substrate facing away from the array portion, wherein the transparent carrier substrate covers only the second display region, and the transparent carrier substrate is made of a rigid material, or the transparent carrier substrate is made of a flexible material that has a hardness greater than that of the thin film encapsulation portion.

14. A method for manufacturing a display panel, the display panel having a first display region and a second display region disposed adjacent to each other, wherein the method for manufacturing the display panel comprises:

providing a base;

manufacturing an array portion on a side of the base; and manufacturing a light-emitting functional portion on a side of the array portion facing away from the base;

wherein said manufacturing the light-emitting functional portion comprises: manufacturing a plurality of Active Matrix Organic Light Emitting Diode (AMOLED) light-emitting units corresponding to the first display region, and manufacturing a plurality of Passive Matrix Organic Light Emitting Diode (PMOLED) light-emitting units corresponding to the second display region;

the method for manufacturing the display panel further comprises:

providing a transparent carrier substrate, and manufacturing a transparent electrode on the transparent carrier substrate; and attaching a side of the transparent carrier substrate, to which the transparent electrode is attached, to a side of the base to which the light-emitting functional portion is attached, and reusing the transparent electrode as a cathode or an anode of each of the plurality of PMOLED light-emitting units, wherein the attaching the side of the transparent carrier substrate to the side of the base comprises: attaching a cathode of each of the plurality of PMOLED light-emitting units to an organic light-emitting layer of the PMOLED light-emitting unit.

15. The method for manufacturing the display panel according to claim 14, wherein said manufacturing the transparent electrode on the transparent carrier substrate comprises: forming the cathode of each of the plurality of PMOLED light-emitting units on the transparent carrier substrate;

wherein said manufacturing the light-emitting functional portion comprises:

forming an anode of each of the plurality of AMOLED light-emitting units and an anode of each of the plurality of PMOLED light-emitting unit;

forming an organic light-emitting layer of each of the plurality of AMOLED light-emitting units and an organic light emitting layer of each of the plurality of PMOLED light-emitting units; and forming a cathode of each of the plurality of AMOLED light-emitting units.

16. The method for manufacturing the display panel according to claim 15, wherein said forming the cathode of the AMOLED light-emitting unit comprises: patterning the cathode of the AMOLED light-emitting unit in such a manner that the cathode of the AMOLED light-emitting unit exposes the second display region.

17. The method for manufacturing the display panel according to claim 14, wherein said manufacturing the transparent electrode on the transparent carrier substrate comprises: forming the anode of each of the plurality of PMOLED light-emitting units on the transparent carrier substrate, and forming an organic light-emitting layer of the PMOLED light-emitting unit on a side of the anode of the PMOLED light-emitting unit facing away from the transparent carrier substrate;

wherein said manufacturing the light-lighting functional portion comprises:

forming an anode of each of the plurality of AMOLED light-emitting units;

forming an organic light-emitting layer of the AMOLED light-emitting unit; and forming, in a same layer, a cathode of the AMOLED light-emitting unit and the cathode of the PMOLED light-emitting unit.

18. The method for manufacturing the display panel according to claim 14, further comprising:

providing a transparent carrier substrate, and manufacturing a transparent trace on the transparent carrier substrate, and attaching a side of the transparent carrier substrate, to which the transparent trace is attached, to a side of the base to which the light-emitting functional portion is attached, such that the plurality of PMOLED light-emitting units contacts the transparent trace.

19. The method for manufacturing the display panel according to claim 18, wherein the transparent electrode or the transparent trace is formed from transparent ITO, and the cathode of the AMOLED light-emitting unit is formed from MgAg.

20. A display device, comprising a display panel, having a first display region and a second display region, wherein the display panel comprises:

a base;

an array portion located on the base; and a light-emitting functional portion located on a side of the array portion facing away from the base, the light-emitting functional portion comprising an Active Matrix Organic Light Emitting Diode (AMOLED) light-emitting unit and a Passive Matrix Organic Light Emitting Diode (PMOLED) light-emitting unit, wherein the AMOLED light-emitting unit is located in the first display region, the PMOLED light-emitting unit is located in the second display region, and the second display region is surrounded or partially surrounded by the first display region, wherein the AMOLED light-emitting unit comprises a first anode and a first cathode, the PMOLED light-emitting unit comprises a second anode and a second cathode, and the second anode of the PMOLED light-emitting unit has an area smaller than an area of the first anode of the AMOLED light-emitting unit; and/or wherein the display panel further comprises a transparent carrier substrate located on a side of the light-emitting functional portion facing away from the base, and the PMOLED light-emitting unit has at least one film layer carried by the transparent carrier substrate, and wherein an auxiliary conductive layer is provided on a side of the transparent carrier substrate facing the base, and the auxiliary conductive layer contacts the first cathode of the AMOLED light-emitting unit and is isolated from the second cathode or the second anode of the PMOLED light-emitting unit.

21. The display device according to claim 20, further comprising:

a back plate located on a back side of the display panel; and a camera or an optical sensor, located between the back plate and the display panel, and further located in a projection of the second display region in a direction perpendicular to the display panel.

* * * * *